United States Patent
Seo et al.

(10) Patent No.: US 10,212,833 B2
(45) Date of Patent: Feb. 19, 2019

(54) BUTTON DEVICE FOR ELECTRONIC DEVICE

(71) Applicant: Samsung Electronics Co., Ltd., Gyeonggi-do (KR)

(72) Inventors: Jae-Il Seo, Gyeonggi-do (KR); Sang-Min Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 193 days.

(21) Appl. No.: 14/955,246

(22) Filed: Dec. 1, 2015

(65) Prior Publication Data
US 2016/0174395 A1    Jun. 16, 2016

(30) Foreign Application Priority Data
Dec. 12, 2014    (KR) .......................... 10-2014-0179459

(51) Int. Cl.
*H05K 7/00*    (2006.01)
*H05K 5/00*    (2006.01)
(Continued)

(52) U.S. Cl.
CPC ........... *H05K 5/0086* (2013.01); *H01H 13/04* (2013.01); *H01H 13/14* (2013.01); *H01H 13/705* (2013.01); *H01H 13/86* (2013.01); *H05K 5/0017* (2013.01); *H01H 2207/002* (2013.01); *H01H 2215/004* (2013.01); (Continued)

(58) Field of Classification Search
CPC ...... H01H 13/04; H01H 13/14; H01H 13/705; H01H 13/86; H01H 2207/002; H01H 2215/004; H01H 2221/05; H01H 2223/002; H01H 2223/014; H05K 5/0017; H05K 5/0086
See application file for complete search history.

(56) References Cited

U.S. PATENT DOCUMENTS

2006/0140461 A1*  6/2006  Kim .................. G06F 1/1613
                                                          382/126
2006/0256510 A1* 11/2006  Nakasono ......... G07C 9/00944
                                                        361/679.02
(Continued)

FOREIGN PATENT DOCUMENTS

CN    101030984 A     9/2007
CN    102214001 A    10/2011
(Continued)

OTHER PUBLICATIONS

European Search Report, dated May 19, 2016.
Chinese Search Report dated Jan. 2, 2018.

*Primary Examiner* — Yuriy Semenenko
(74) *Attorney, Agent, or Firm* — Cha & Reiter, LLC

(57) ABSTRACT

An electronic device may include a first member that forms at least a part of an exterior of the electronic device and includes an opening; a second member that is disposed inside the electronic device; at least one electronic component that is disposed between the first member and the second member not to overlap with the opening of the first member; and a button device disposed inside the electronic device. The button device may include a button that is inserted into the opening of the first button and a dome switch that is disposed at a position where the dome switch is pressed by the button.

10 Claims, 24 Drawing Sheets

(51) Int. Cl.
      *H01H 13/705*    (2006.01)
      *H01H 13/86*    (2006.01)
      *H01H 13/04*    (2006.01)
      *H01H 13/14*    (2006.01)

(52) U.S. Cl.
     CPC ... *H01H 2221/05* (2013.01); *H01H 2223/002* (2013.01); *H01H 2223/014* (2013.01)

(56) References Cited

U.S. PATENT DOCUMENTS

| | | | |
|---|---|---|---|
| 2007/0205122 A1 | 9/2007 | Oda et al. | |
| 2012/0138441 A1* | 6/2012 | Kim | H01H 13/705 200/5 A |
| 2013/0156233 A1* | 6/2013 | Joo | H04M 1/03 381/151 |
| 2013/0217444 A1* | 8/2013 | Lee | H04M 1/0249 455/566 |
| 2014/0252883 A1* | 9/2014 | Dinh | H01H 13/06 307/125 |
| 2014/0302705 A1* | 10/2014 | Park | H01R 12/714 439/374 |
| 2015/0062844 A1* | 3/2015 | Bae | H04M 1/0249 361/752 |

FOREIGN PATENT DOCUMENTS

KR    10-2014-0080237 A    6/2014
KR    10-1401906 B1    6/2014

* cited by examiner

BUTTON DEVICE FOR ELECTRONIC DEVICE

CLAIM OF PRIORITY

This application claims the priority under 35 U.S.C. § 119(a) to Korean Application Serial No. 10-2014-0179459, which was filed in the Korean Intellectual Property Office on Dec. 12, 2014, the entire contents of which are hereby incorporated by reference.

TECHNICAL FIELD

The present disclosure generally relates to a button device for an electronic device.

BACKGROUND

Typically, electronic devices, and more particularly, portable electronic devices are provided with a button as an input means. Meanwhile, the electronic devices may be equipped with a touch screen based on a Graphical User Interface (GUI) environment. Increasingly, touch screens of electronic devices have been designed to perform functions that were previously performed by physical buttons. However, physical buttons are still advantageous because they can be conveniently and rapidly operated. They also provide a push feeling (or click feeling) to users.

These electronic devices often include a button and a push-button type switch that causes a current to flow between two contacts when it is pushed. Typically, an assembled structure in which a button and a dome switch are interposed between device members and the button is exposed to the outside through an opening formed in one device member. Conventionally, the device members, the button, and the dome switch are assembled together to form an operable button device. As a result, an abnormality (e.g., the deterioration of the click feeling) in operating the button device would result when the elements were not assembled in the correct assembly position. When the abnormality in operating the button device has occurred, it would be necessary for an operator to disassemble the assembled structure and check the relationship between the elements in order to find the reason for the abnormality. In addition, when there is a cumulative tolerance, it is difficult to mount the above-described assembled structure in the electronic device at a desired size relationship, which causes a deformation (e.g., swelling) that in turn causes an abnormality in the button operation.

SUMMARY

Various embodiments disclosed herein are to provide a button device for a terminal, which may be easily installed to or separated from the terminal.

Various embodiments disclosed herein are to provide a button device for a terminal that is configured to prevent an abnormal operation due to a cumulative tolerance.

In order to solve at least the above-mentioned problems, an electronic device, according to an embodiment of the present disclosure, may include: a first member (e.g., a window) that forms at least a part of an exterior of the electronic device and includes an opening; a second member that is disposed inside the electronic device; at least one electronic component (e.g., a display or any other hardware component) that is disposed between the first member and the second member not to overlap with the opening of the first member; a button device that includes a button that is inserted into the opening of the first button and a dome switch that is disposed at a position where the dome switch is pressed by the button. The button device may be disposed inside the electronic device.

According to various embodiments of the present disclosure, because the button device is not affected by a tolerance that may occur while being coupled with other members, the button can be normally operated. In addition, because the button device is integrally formed and mounted in the terminal, an abnormality in the button operation is restricted to the button device, a rapid measure for solving the problem can be taken.

These and other aspects and embodiments of the present disclosure are more fully described hereinbelow.

BRIEF DESCRIPTION OF THE DRAWINGS

The above and other aspects, features, and advantages of the present disclosure will be more apparent from the following detailed description taken in conjunction with the accompanying drawings, in which.

Throughout the drawings, it should be noted that like reference numbers are used to depict the same or similar elements, features, and structures.

DETAILED DESCRIPTION

Figure 1:
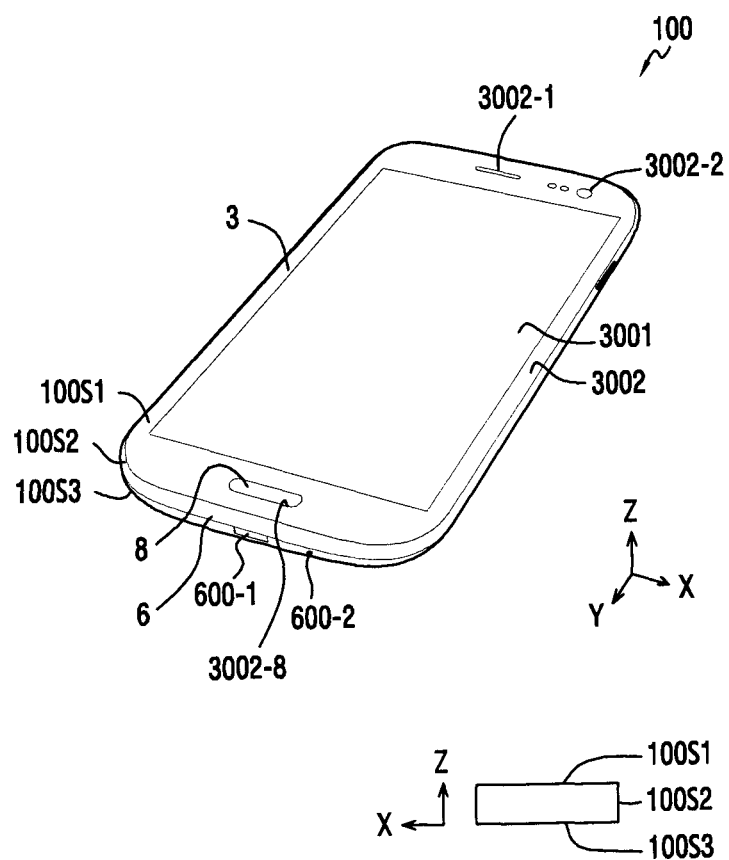
FIG. 1 is a perspective view of a terminal according to an embodiment of the present disclosure.

The various embodiments used to describe the principles of the present disclosure are by way of illustration only and should not be construed in any way to limit the scope of the disclosure. Those skilled in the art will understand that the principles of the present disclosure may be implemented in any suitably arranged electronic device. The following description with reference to the accompanying drawings is provided to assist in a comprehensive understanding of various embodiments of the present disclosure as defined by the claims and their equivalents. It includes various specific details to assist in that understanding, but these are to be regarded as merely examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural references unless the context clearly dictates otherwise. Thus, for example, any reference to "a component surface" includes reference to one or more of such surfaces.

The expressions "include", "may include", etc. as used in the present disclosure refer to the existence of a corresponding disclosed function, operation or component which may be used in various embodiments of the present disclosure and do not exclude one or more additional functions, operations, or components. In the present disclosure, the expressions such as "include", "have", etc. may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof. The expression "or", etc. as used in various embodiments of the present disclosure includes any or all of combinations of listed words. For example, the expression "A or B" may include A, may include B, or may include both A and B.

The expression "1", "2", "first", or "second" used in various embodiments of the present disclosure may modify various components of various embodiments, but does not limit the corresponding components. For example, the above expressions do not limit the sequence and/or importance of the elements. The above expressions are used merely for the purpose of distinguishing an element from other elements. For example, a first user device and a second user device indicate different user devices although both of them are user devices. For example, without departing from the scope of the present disclosure, a first component element may be named a second component element. Similarly, the second component element also may be named the first component element.

It should be noted that if one component element is described as being "coupled" or "connected" to another component element, the first component element may be directly coupled or connected to the second component, and a third component element may be "coupled" or "connected" between the first and second component elements. Conversely, when one component element is "directly coupled" or "directly connected" to another component element, no third component element exists between the first component element and the second component element.

The terms in various embodiments of the present disclosure are used to describe various embodiments, and are not intended to limit the present disclosure. As used herein, the singular forms are intended to include the plural forms as well, unless the context clearly indicates otherwise.

Unless defined differently, all terms used herein, which include technical terminologies or scientific terminologies, have the same meaning as would be understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present disclosure.

An electronic device according to various embodiments of the present disclosure may be a device that has a communication function. For example, the electronic device may include at least one of a smartphone, a tablet personal computer (PC), a mobile phone, a video phone, an e-book reader, a desktop PC, a laptop PC, a netbook computer, a personal digital assistant (PDA), a portable multimedia player (PMP), an MP3 player, a mobile medical device, a camera, and a wearable device (such as a head-mounted-device (HMD), electronic glasses, electronic clothes, an electronic bracelet, an electronic necklace, an electronic appcessory (e.g., an electronic device and/or counterpart accessory for a mobile device), an electronic tattoo, a smart watch, or the like).

According to various embodiments, the electronic device may be a smart home appliance with a communication function. The smart home appliance as an example of the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a TV box (such as SAMSUNG HOMESYNC™, APPLE TV™, or GOOGLE TV™), a game console, an electronic dictionary, an electronic key, a camcorder, and an electronic picture frame.

According to various embodiments, the electronic device may include at least one of various medical appliances (such as Magnetic Resonance Angiography (MRA), Magnetic Resonance Imaging (MRI), Computed Tomography (CT) machine, and an ultrasonic machine), navigation devices, Global Positioning System (GPS) receivers, Event Data Recorders (EDRs), Flight Data Recorders (FDRs), automotive infotainment devices, electronic equipment for ships (such as navigation equipment for ships, gyrocompasses, or the like), avionics, security devices, head units for vehicles, industrial or home robots, Automatic Teller Machines (ATMs) of banking facilities, and Point Of Sales (POSs) of shops.

According to various embodiments, the electronic device includes at least one of furniture or a part of a building/structure, an electronic board, an electronic signature receiving device, a projector, and various types of measuring devices (for example, a water meter, an electric meter, a gas meter, a radio wave meter and the like). An electronic device according to various embodiments of the present disclosure may be a combination of one or more of above-described various devices. Also, an electronic device according to various embodiments of the present disclosure may be a flexible device. Also, an electronic device according to various embodiments of the present disclosure is not limited to the above-described devices. Hereinafter, an electronic device according to various embodiments will be described with reference to the accompanying drawings. The term "user" used in various embodiments refers to a person who uses an electronic device or a device (for example, an artificial intelligence electronic device) that uses an electronic device.

FIG. 1 illustrates a terminal according to an embodiment of the present disclosure.

Referring to FIG. 1, the terminal 100 has a substantially quadrangle (e.g., rectangular) plate shape, and may have a rectangular shape as illustrated in the drawing. The terminal 100 may have an exterior that is formed by a plurality of surfaces 100S1, 100S2, and 100S3. Two surfaces 100S1 and 100S3 are disposed to be opposite to each other, and another surface 100S2 may be a surface that interconnects the two surfaces 100S1 and 100S3, and thereby enclosing a space between the two surfaces 100S1 and 100S3. The surface 100S1 may be a planar surface as illustrated or may be a curved surface but is not limited eto these configurations or shapes. For example, the surface 100S1 may be a convexly or concavely curved surface. Another surface (or the bottom surface) 100S3 may be a planar surface or a curved surface. For example, the other surface 100S3 may be a curved surface, and the terminal 100 may be rolled by using such a curved surface.

The terminal 100 may include a display set 3, a case 6, and a button device 8. The display set 3 is a device that provides a screen 3001, and may include a display, such as an LCD (liquid-crystal display) or an AM-OLED (active-matrix organic light-emitting diode). Alternatively, the display set 3 may include a touch-sensible device (e.g., a touch panel) or a digitizer panel. As illustrated, the display set 3 may form the surface 100S1 of the terminal 100.

The display set 3 may provide a display surface (i.e., a screen 3001) and a non-display surface 3002. The display surface 3001 may be a surface that displays an image generated from a display (not illustrated) of the display set 3. The display surface 3001 may be formed as a surface that receives a touch with the support of the touch panel. The non-display surface 3002 is separated from the display surface 3001. The non-display surface 3002 may have a shape that surrounds the display surface 3001 as illustrated, and may have a color (e.g., black) that visually differentiates it from the display surface 3001.

The non-display surface 3002 may provide a through-hole 3002-1 so as to support the speaker that is equipped inside the terminal 100. In addition, the non-display surface 3002 may include a transparent portion 3002-2 that supports an optical component (e.g., an illuminance sensor or a camera). In particular, the non-display surface 3002 may provide a button pass hole 3002-8 that supports the button device 8. The button of the button device 8 may be exposed to the outside through the button pass hole 3002-8 in the non-display surface 3002.

The case 6 is coupled to the display set 3 and may form one or more surfaces of the terminal 100 (e.g., the surfaces 100S2 and 100S3). The case 6 may provide a through-hole 600-1 that supports a socket that is equipped within the terminal 100 (e.g., a USB socket, a charge jack, or a communication jack). In addition, the case 6 may include a through-hole 600-2 that supports a microphone that is equipped within the terminal 100.

The button device 8 may be equipped within the terminal 100, and the button of the button device 8 may be exposed to the outside through the button pass hole 3002-8 of the display set 3.

Figure 2:
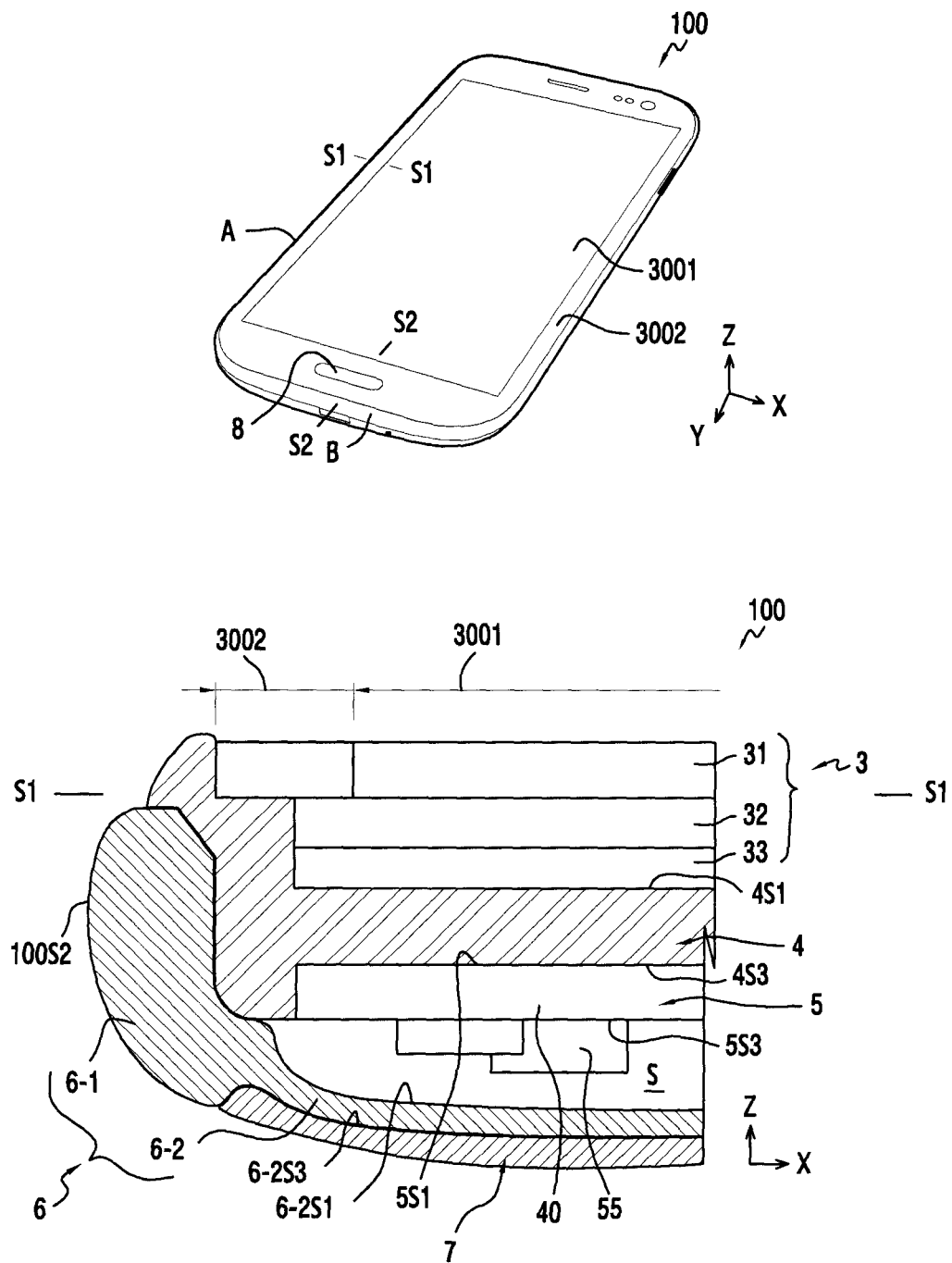
FIG. 2 is a cross-sectional view of the terminal of FIG. 1 according to the embodiment of the present disclosure.

According to an embodiment, the button device 8 may be a single electronic component that is disposed between the display set 3 and the bracket 4 (see FIG. 2). The button device 8 may be independently provided with all the configurations that enable the button push operation.

According to another embodiment, the button device 8 may exist in a state where it is attached to the display set 3, and a part of the display set 3 may be allocated as a constituent element of the button device 8. In other words, the button device 8 may include all the configurations that enable the button push operation, for example, by including at least a portion of the display set 3 in the configurations. When the display set 3 and the bracket 4 are separated from each other, the button device 8 may be separated from the bracket 4 together with the display set 3.

According to another embodiment, the button device 8 may be in a state where it is attached to one surface of the bracket 4 that is positioned between the display set 3 and the circuit board 5 (see FIG. 2). Here, a part of the bracket 4 may be allocated as a constituent element of the button device 8. In other words, the button device 8 may include all the configurations that enable the button push operation by including at least a portion of the bracket 4 in the configurations. When the display set 3 and the bracket 4 are separated from each other, the button device 8 may be separated from the display set 3 together with the bracket 4.

According to another embodiment, the button device 8 may exist in a state where it is mounted on one surface of the bracket 4 that exists between the display set 3 and the circuit board 5 (see FIG. 2). Here, a part of the bracket 4 may be allocated as a constituent element of the button device 8. In other words, the button device 8 may include all the configurations that enable the button press operation by including at least a portion of the bracket 4 in the configurations. When the bracket 4 and the circuit board 5 are separated from each other, the button device 8 may be separated from the bracket 4 along with the circuit board 5.

According to the above-described various embodiments, the button device 8 may have a rigidity that resists deformation by external stress or forces, and may support maintaining the normal button push operation. For example, even in the case where a cumulative tolerance exists when the above-described elements 3, 4, 5, and 6 are assembled, an abnormal button push operation (e.g., deterioration of the click feeling) will not be induced by such a cumulative tolerance because the button device 8 has already been provided with all the configurations that enable the normal button push operation.

According to various embodiments, the terminal 100 may include one or more sensors (e.g., a gesture sensor, a proximity sensor, a grip sensor, a gyro sensor, an acceleration sensor, a geomagnetic sensor, an atmospheric pressure sensor, a temperature/humidity sensor, a hole sensor, an RGB (red, green, blue) sensor, an illuminance sensor, a biometric sensor (e.g., a heartrate sensor or a fingerprint recognition sensor), or a ultra-violet (UV) sensor. According to one embodiment, one of the sensors (e.g., the fingerprint recognition sensor) may be configured on the button device 8.

According to various embodiments of the present disclosure, specific configurations may be excluded from the above-described configurations and may be replaced by other configurations, or added, depending on the type of the terminal 100. This can be easily understood by a person ordinarily skilled in the technical field of the present disclosure.

FIG. 2 illustrates a cross-sectional view of a terminal according to an embodiment of the present disclosure. Here, configurations for a part of the terminal 100 are provided, but they may not be applied to the entire terminal 100.

Referring to FIG. 2, the terminal 100 may include a display set 3, a bracket 4, a main circuit board 5, a case 6, and a cover 7.

The display set 3 may include a window 31, a display 32, and a display circuit board 33.

The window 31 has a plate shape and is disposed on the display 32 so that the window 31 may form one surface (e.g. the surface 100S1 of FIG. 1) of the terminal 100. The window 31 may include a shock-resistant plastic or glass. According to an embodiment, the window 31 may form a transparent area that corresponds to a display surface 3001, and an opaque area that corresponds to a non-display surface 3002.

The display 32 may be disposed between the window 31 and the display circuit board 33, and the image generated from the display 32 may be visible from the outside through the transparent area of the window 31. The display 32 may have a plate, planar, and/or rectangular shape.

The display circuit board 33 may be disposed between the display 32 and a portion of the bracket 4 and may control the image output that is performed through the display 32.

According to various embodiments, the display set 3 may further include a touch panel that is disposed between the window 31 and the display 32. The display set 3 may further include a digitizer panel that is disposed between the display 32 and the display circuit board 33. The touch panel or the digitizer panel may support a touch input through the display surface 3001 of the display set 3.

The bracket 4 may be a part on which the display set 3 and the main circuit board 5 are installed, and may have a plate shape that substantially follows the rectangular shape of the terminal 100. The bracket 4 may be a part on which electronic components may be installed, and may support a first surface 4S1 and a second surface 4S3 that are opposite to each other. As illustrated, the bracket 4 may be a structure that is disposed adjacent to the display set 3 and the main circuit board 5 in which the first surface 4S1 of the bracket 4 may be allocated as a part on which the display set 3 may be installed, and the second surface of the bracket 4 may be allocated as a portion on which the main circuit board 5 may be installed. Each of the first and second surfaces 4S1 and 4S3 of the bracket 4 may have a recessed shape so that the display set 3 or the main circuit board 5 can be seated therein. Accordingly, the display set 3 and the main circuit board 5 may be mounted without a clearance in a manner of being fitted to the bracket 4.

The bracket 4 may impart a rigidity to the display set 3 and the main circuit board 5. In addition, the bracket 4 may be used as a radiator that shields electronic waves, blocks electric noise, and/or prevents the electronic components from being heated. The bracket 4 may be formed of a metal, such as magnesium (Mg) or aluminum (Al). Without being limited thereto, however, the bracket 4 may be formed of a non-metal material, such as a plastic. In addition, the bracket 4 may be coated with a substance that shields electronic waves.

The main circuit board 5 (or main board or mother board) is a part on which a plurality of electronic components 55 are mounted through a first surface 5S1 and/or a second surface 5S3 thereof and an electric circuit that interconnects the electronic components 55. The main circuit board 5 may support the setting of an execution environment of the terminal 100, maintaining of the information of the execution environment, and data input/output and exchange of the devices within the terminal 100. The main circuit board 5 may be disposed in a state where it is coupled to the bracket 4.

The first surface 5S1 of the main circuit board 5 may be at least partially in contact with the second surface 4S3 of the bracket 4, and the second surface 4S3 of the bracket 4 may provide a space (not illustrated) that is capable of accommodating the electronic components (not illustrated) mounted on the first surface 5S1 of the main circuit board 5. Between the second surface 4S3 of the main circuit board 5 and the case 6, a space S is provided, and the electronic components 55 mounted on the second surface 4S3 of the main circuit board 5 may be accommodated in the space S.

The case 6 substantially has a top-opened bowl shape, and may be coupled with the bracket 4 so as to form an entire frame of the terminal 100. The electronic components (e.g., the display set 3 and the main circuit board 5) may be mounted on the frame structure that is formed by the case 6 and the bracket 4 and may be disposed within the terminal 100. The case 6 may include a first portion 6-1 that forms the other surface 100S2 of the terminal 100, and a second portion 6-2 that extends from the first portion 6-1 and is disposed below the bracket 4. The first portion 6-1 may have a shape that is capable of being combined with the bracket 4 in a conformal manner (e.g., the first portion 6-1 and the bracket may be corresponding shapes that fit together). Thus, as illustrated, the rim portion of the bracket 4 may be fitted to the inner shape of the first portion 6-1, and the bracket 4 may be fitted onto the case 6 without a clearance. The second portion 6-2 has a shape that covers the second surface 4S3 of the bracket 4. The inner surface 6-2S1 of the second portion 6-2 may be smooth as illustrated, but may have various concave-convex shapes without being limited thereto. For example, the inner surface 6-2S1 of the second portion 6-2 may have at least one rib (not illustrated) that extends to the bracket 4, and the rib may serve to support the bracket 4. Alternatively, the inner surface 6-2S1 of the second portion 6-2 may have at least one rib (not illustrated) that extends to the main circuit board 5, and the rib may serve to support the main circuit board 5.

The second portion 6-2 may have a through-hole (not illustrated), and some of the electronic components 55 on the main circuit board 5 (e.g., a memory socket) may be introduced into the through-hole of the second portion 6-2. When a cover 7, as described hereinbelow, covers the second portion 6-2 of the case 6, the electronic components on the main circuit board 5 disposed in the through-hole of the second portion 6-2 may not be visible. On the other hand, when the cover 7 is separated from the case 6, the electronic components on the main circuit board 5 disposed in the through-hole of the second portion 6-2 may be exposed.

According to various embodiments, the case 6 may include a conductive material, and may be configured to be conductive to the ground surface of the main circuit board 5. For example, the conductive material may be coated on the inner surface 6-2S1 of the second portion 6-2 of the case 6. Conduction between the conductive material of the case 6 and the ground surface of the main circuit board 5 may be induced by causing the rib of the second portion 6-2 to be in contact with the ground surface of the main circuit board 5. Here, the rib of the second portion 6-2 may include a conductive rubber gasket that causes the rib to come in elastic, as well as electrical, contact with the ground surface of the main circuit board 5.

The cover 7 may be coupled to the second portion 6-2 of the case 6, and may form the surface 100S3 of the terminal 100. The cover 7 has a curved shape, and the surface 100S3 of the terminal 100 may be formed as a curved surface. The second portion 6-2 of the case 6 may have a recessed shape on which the cover 7 may be seated. Accordingly, the cover 7 may be mounted without a clearance by being fitted to the second portion 6-2 of the case 6. In addition, the cover 7 may be snap-fitted to the second portion 6-2 of the case 6, and the cover 7 may be separated from the second portion 6-2 of the case 6. In order to attach/detach an electronic component (e.g., a memory card or a battery pack), the cover 7 may be separated from the case 6.

The portion S1-S1 of the terminal 100, which corresponds to the long side A of the terminal 100, may form the structure of the terminal 100 as illustrated in FIG. 2, and the portion S2-S2, which corresponds to the short side B of the terminal 100, may further include a button device (the button 8 of FIG. 1) in this configuration. The button device 8 is may be disposed between the display set 3 and the bracket 4 as a single component having a unit configuration that enables the button push operation. Alternatively, the button device 8 may be coupled (or attached) to the display set 3, and a part of the display set 3 may be used as a constituent element of the button device 8. Alternatively, the button device 8 may be coupled to the bracket 4, and a part of the bracket 4 may be used as a constituent element of the button device 8.

Figure 3:
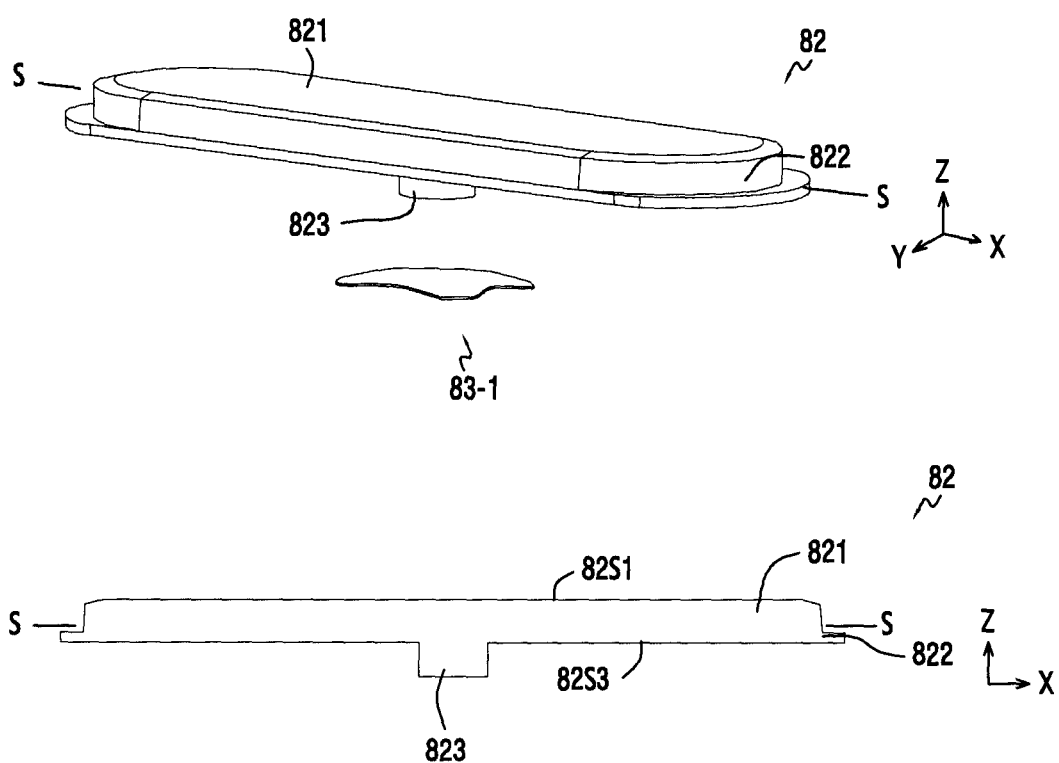
FIG. 3 illustrates a button and a dome switch of a button device according to an embodiment of the present disclosure.

FIG. 3 illustrates a button and a dome switch of a button device 8 according to an embodiment of the present disclosure.

Referring to FIG. 3, a button 82 is installed in the terminal 100 such that a dome switch can be pushed to the inside of the terminal 100 by the button 82. The button 82 may include a button top 821 that is disposed in a button pass hole 3002-8 (see FIG. 1) of the non-display surface 3002 of the display set 3, and a first surface 82S1 of the button top 821 is exposed to be used as a portion pushed by the user. As illustrated, the button top 821 may have a plate shape, and includes the first surface 82S1 and a second surface 82S3 in opposite direction to the first surface 82S1. In addition, the button 82 may have a flange (or a lip) 822 that extends radially from a rim of the button top 821. The flange 822 may prevent the button top 821 from getting away from the button device 8 in the direction opposite to the button push direction. In addition, the button 82 may have a protrusion (or an actuator) 823 that protrudes from a second surface 82S3 of the button top 821. When the button 82 is pushed, the actuator 823 presses the dome switch, and a current may be conducted between two contacts of the dome switch.

Figure 4:
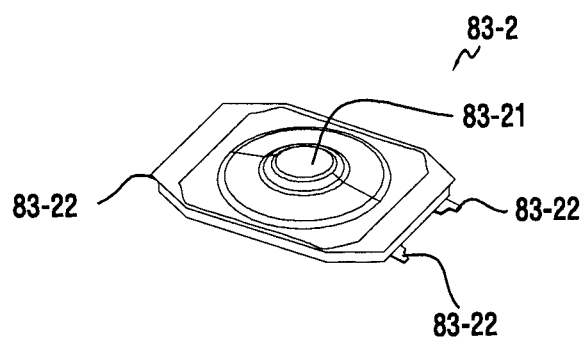
FIG. 4 illustrates a dome switch according to an embodiment of the present disclosure.

As illustrated, the dome switch may be implemented as a sheet including a metal dome, that is, a dome sheet 83-1. For example, the dome switch may be formed by forming two separated contacts formed on the mounting surface of a substrate, and attaching the dome sheet to the mounting surface of the substrate. Alternatively, the dome switch may be a surface mount type dome switch as shown in FIG. 4. The surface mount type dome switch 83-2 may include the metal dome 83-21 and contacts (e.g., two contacts) (not illustrated). Alternatively, the surface mount type dome switch 83-2 may include soldering leads 83-22, which may be mounted on the substrate by fixing the leads 83-22 to lands (or copper foil pads) by soldering.

Figure 5A:
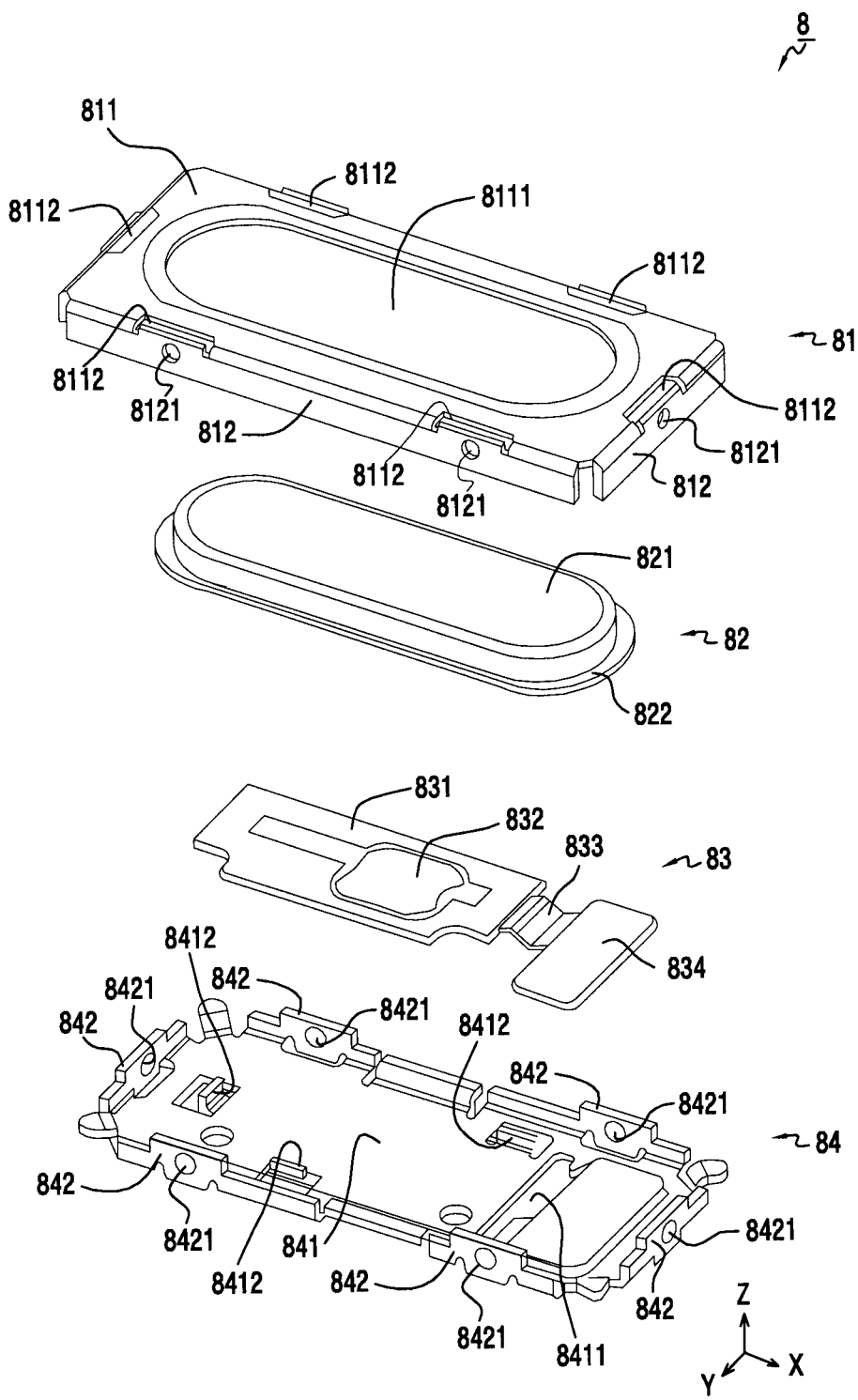
FIG. 5A and FIG. 5B are perspective views illustrating a button device according to an embodiment in a disassembled state.
Figure 5B:
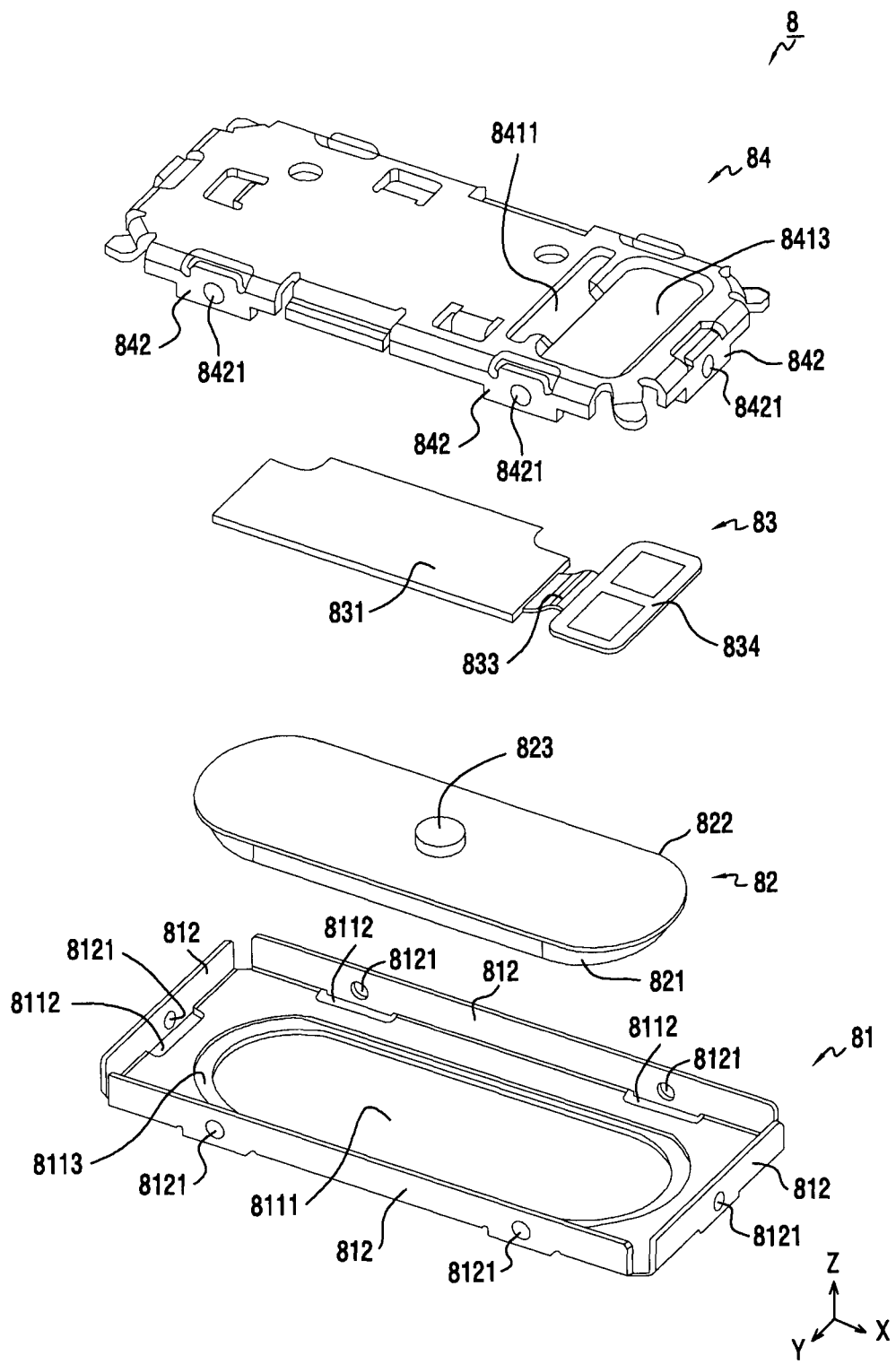

FIGS. 5A and 5B are perspective views illustrating a button device according to an embodiment in a disassembled state.

Referring to FIGS. 5A and 5B, a button device 8 may include a first housing 81, a second housing 84, a button 82, and a dome switch circuit 83. The first housing 81 and the second housing 84 are coupled to each other so as to provide a mounting space, and the button 82 and the dome switch circuit 83 may be mounted in the mounting space.

The first housing 81 may include a ceiling portion 811, and sidewall portions 812 that extend from the rim of the ceiling portion 811 in the vertical direction (i.e., toward the second housing 84). As illustrated, the ceiling portion 811 has a substantially rectangular shape, and an opening 8111 may be formed inside the rim thereof. The button top 821 of the button 82 may be inserted into the opening 8111 of the ceiling portion 811 to be exposed to the outside. Alternatively, the ceiling portions 811 may have an annular recess 8113 that is formed on the inner surface along the rim of the opening 8111. The flange 822 of the button 82 may be installed by being fitted to the recess 8113. According to various embodiments, the ceiling portion 811 may have through-holes 8112 in the rim that is connected with the sidewall portions 812. To the through-holes 8112, the ends of the sidewall portions 842 of the second housing 84 may be fitted when the ceiling portion 811 is coupled with the second housing 84. The sidewall portions 812 are portions to be coupled with the second housing 84. As illustrated, the sidewall portions 812 may be separated from each other and may include through-holes 8121 to be snap-fitted to the second housing 84.

The second housing 84 may include a bottom portion 841 and sidewall portions 842 that extend from the rim of the bottom portion 841 in the vertical direction (i.e., toward the first housing 81). As illustrated, the bottom portion 841 has a substantially rectangular shape, and a through-hole 8411 that supports the installation of the dome switch circuit 83 and a plurality of ribs 8412 that protrude toward the first housing 81 are formed inside the rim of the bottom portion 841. The sidewall portions 842 may be coupled to the first housing 81. As illustrated, the sidewall portions 842 may have semi-spherical protrusions 8421 that can be snap-fitted to the through-holes 8121 of the sidewall portion 812 of the first housing 81. The sidewall portions 842 of the second housing 84 may be fitted between the sidewall portions 812 of the first housing 81. For example, when the first housing 81 and the second housing 84 are coupled to each other, the sidewall portions 812 of the first housing 81 may be flexed outwardly due to the protrusions 8421 of the second housing 84, and may then be returned to the original state thereof when the protrusions 8421 of the second housing 84 are fitted to the through-holes 8121 of the first housing 81. According to various embodiments, the second housing 84 may further include a recess 8413 on the outer surface of the bottom portion 841 so that the outer contacts 834 of the dome switch circuit 83 may be installed in the recess 8413.

The dome switch circuit 83 may include a substrate 831, a metal dome 832, an FPCB 833, and external contacts 834. The substrate 831 is a portion on which the metal dome 832 may be installed, and may include a plurality of contacts (not illustrated), which are disposed to be spaced apart from each other below the metal dome 832. The bottom portion 841 of the second housing 84 may form a fit-in area that is formed by a plurality of ribs 8412, and the substrate 831 may be installed in the fit-in area. That is, because the plurality of ribs 8412 support the rim of the substrate 831, the position of the substrate 831 can be maintained on the bottom portion 841 of the second housing 84. As illustrated in FIG. 3, the metal dome 832 may be configured to contact the dome sheet 83-1. The FPCB 833 may electrically interconnect the two contacts of the substrate 831 and external contacts 834. The FPCB 833 may extend through the through-hole 8411 of the second housing 84, and the external contacts 834 may be disposed on the FPCB 833. The external contacts 834 may be attached to the recess 8413 formed on the outer surface of the second housing 84 by using an adhesive means, such as a double-sided tape. The external contacts 834 may be electrically connected to the main circuit board 5 (see FIG. 2).

The button 82 may be disposed between the first housing 81 and the dome switch circuit 83. As illustrated in FIG. 3, the button 82 may include the button top 821, the flange 822, and the actuator 823. Because the button top 821 is installed by being inserted into the opening 8111 of the first housing 81 and the flange 822 has a width wider than the opening 8111, the button top 821 may be disposed in the opening 8111 of the first housing 81 in a state where it does not fully pass through the opening 8111 of the first housing 81 due to the flange 822. The actuator 823 may be in contact with the metal dome 832 of the dome switch circuit 83, and in response to a button push operation, the button top 821 may be moved to the inside of the button device 8 so that the actuator 823 may press the metal dome 832. The metal dome 832 is deformed by being pressed by the actuator 823, and an electrical current can be conducted between the two contacts mounted on the substrate 831 due to the deformation of the metal dome 832.

Figure 6A:
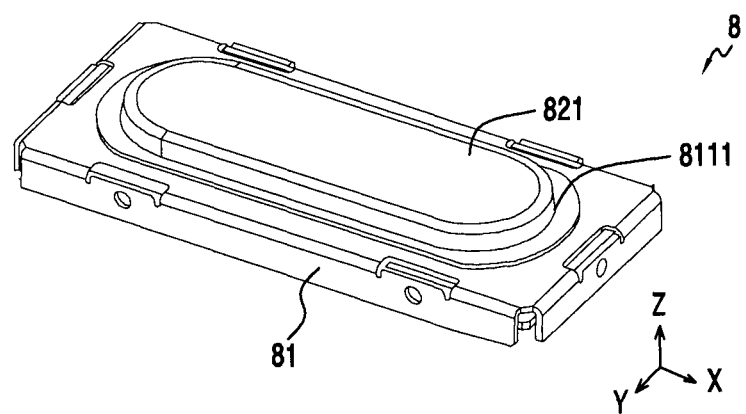
FIG. 6A and FIG. 6B are perspective views illustrating the button device according to the embodiment of the present disclosure in the assembled state.
Figure 6B:
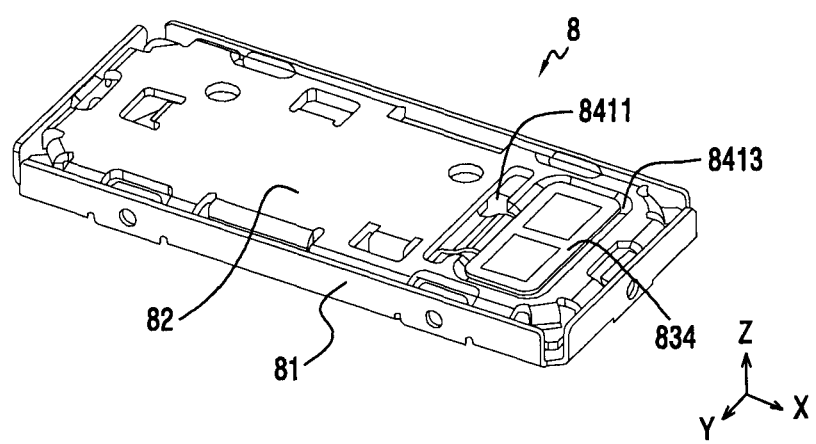

FIGS. 6A and 6B are perspective views illustrating the button device according to the embodiment of the present disclosure in the assembled state.

Referring to FIGS. 6A and 6B, the first housing 81 and the second housing 84 may be coupled to each other to form a substantially rectangular box. The button top 821 of the button 82 may pass through the opening 8111 of the first housing 81 to be exposed to the outside. Alternatively, the external contacts 834 of the dome switch circuit 83 may extend to the outside through the opening 8411 of the second housing 84, and may be coupled or attached to the recess 8413 of the bottom portion 841 of the second housing 84.

Figure 7:
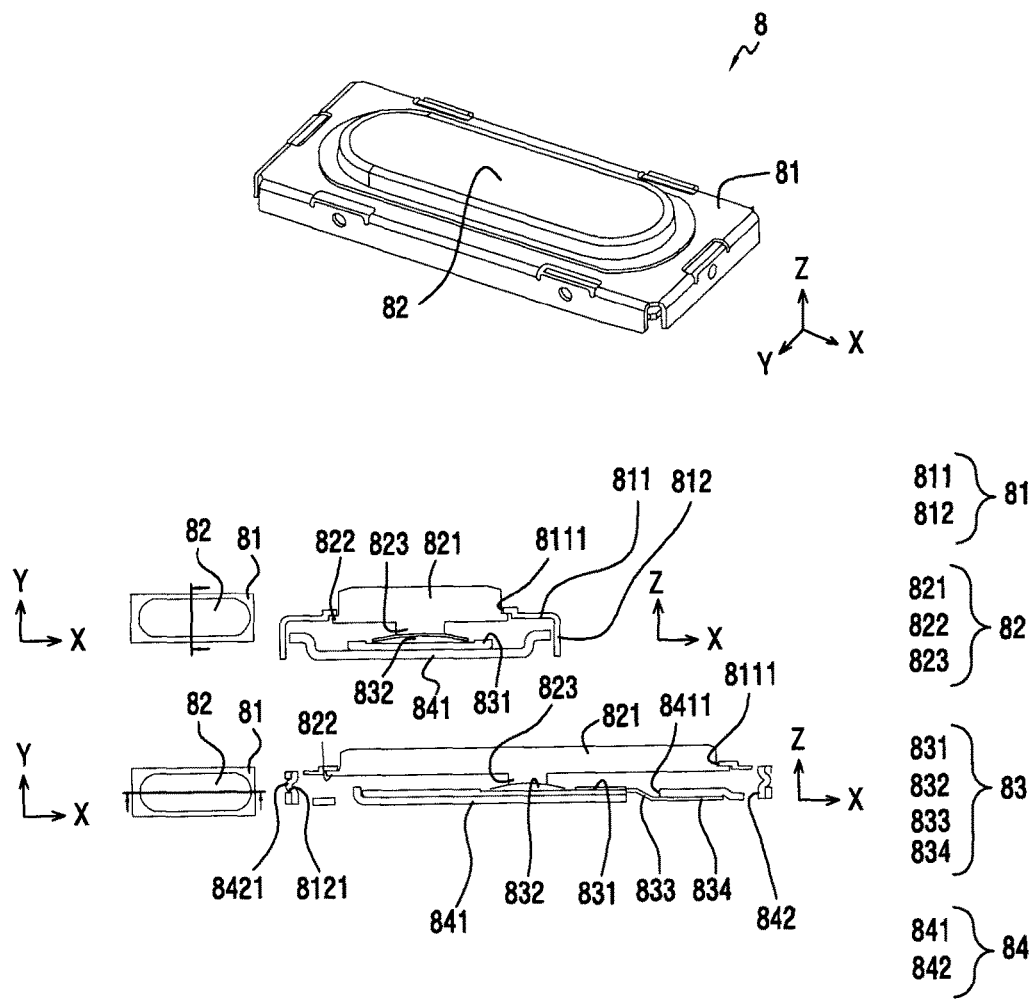
FIG. 7 illustrates cross-sectional views of the button device according to the embodiment of the present disclosure.

FIG. 7 illustrates cross-sectional views of the button device 8 according to the embodiment of the present disclosure.

Referring to FIG. 7, the first housing 81 may include first sidewall portions 812 that extend from the rim of the ceiling portion 811 in the vertical direction, and the second housing 84 may include second sidewall portions 842 that extend from the rim of the bottom portion 841 in the vertical direction. The second housing 84 may be coupled to the first housing 81 by fitting the second sidewall portions 842 thereof between the first sidewall portions 812 of the first housing 81. Here, the protrusions 8421 of the second sidewall portion 842 and the through-holes 8121 of the first sidewall portion 812 may be snap-fitted to each other at various locations. Due to this, the first sidewall portion 812 and the second sidewall portion 842 may be coupled to each other in the overlapping state, and as a result, the first housing 81 and the second housing 84 are coupled to each other.

Due to the assembly of the first housing 81 and the second housing 84, a space may be provided in which the button 82 and the dome switch circuit 83 may be mounted. For example, the button top 821 of the button 82 is inserted into the opening 8111 formed in the ceiling portion 811 of the first housing 81, and the actuator 823 of the button 82 may be disposed in the state where it is in contact with the metal dome 832 that is mounted on the substrate 831 of the dome switch circuit 83. For example, the button 82 may be supported by the metal dome 832 of the dome switch circuit 83, and the flange 822 of the button 82 may be disposed in the state where it is in close contact with a step around the opening 8111 of the first housing 81. The substrate 831 of the dome switch circuit 83 may be installed on the bottom portion 841 of the second housing 84, and the external contacts 834 of the dome switch circuit 83 may extend from the substrate 831 to pass through the opening 8411 of the bottom portion 841 of the second housing 84 and may be attached to the outer surface of the bottom portion 841.

Figure 8:
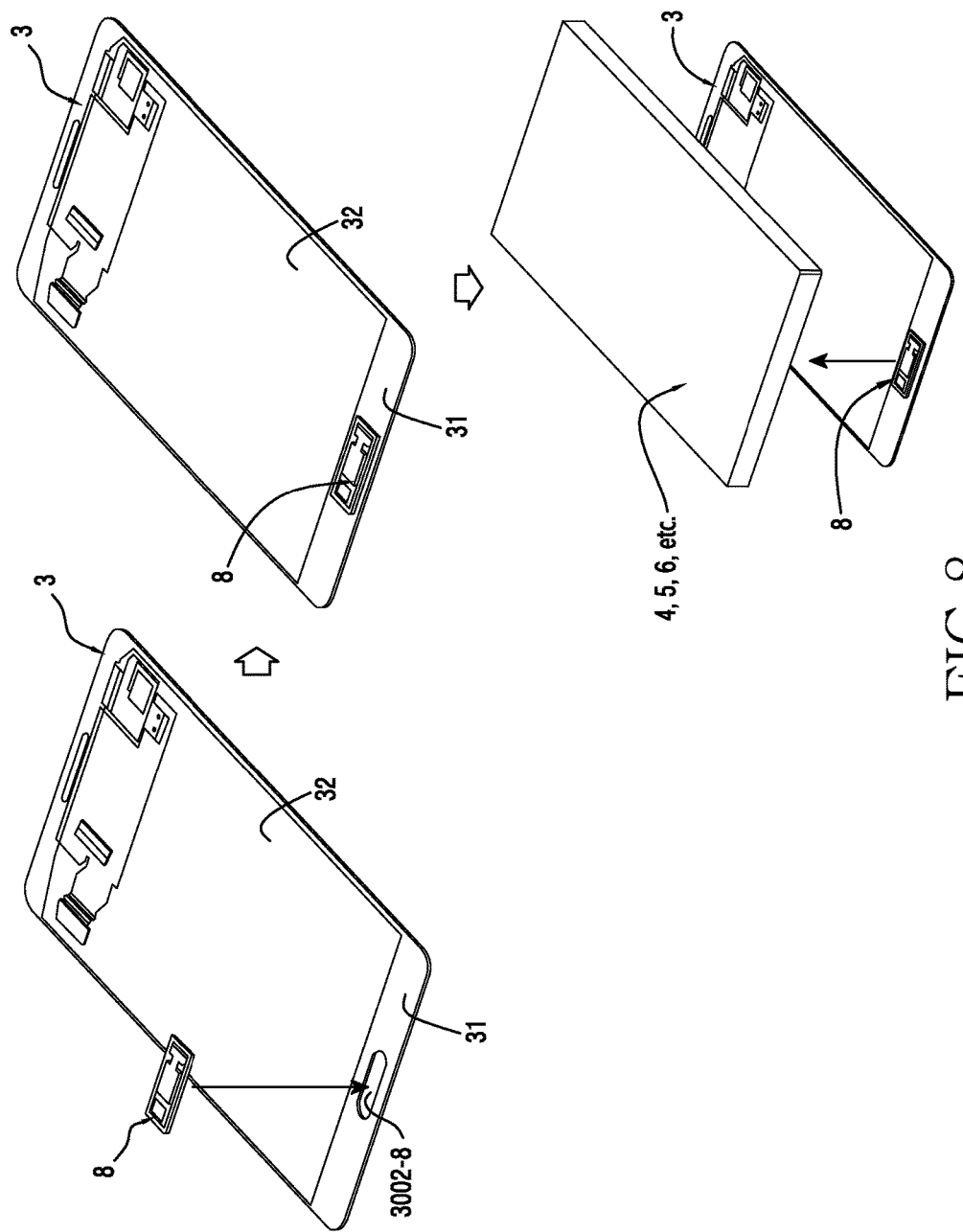
FIG. 8 illustrates a process of installing the button device according to the embodiment of the present disclosure to a terminal.

FIG. 8 illustrates a process of installing the button device according to the embodiment of the present disclosure to a terminal.

Referring to FIG. 8, the button device 8 may be coupled to the button pass hole 3002-8 formed on the window 31 of the display set 3. The button pass hole 3002-8 may be formed in an area where it does not overlap with the display 32. The button top 821 (see FIG. 7) of the above-described button device 8 may be inserted into and fitted to the button pass hole 3002-8 of the window 31, thereby exposing the button top 821 to the outside. The remaining elements (the bracket 4, the main circuit board 5, the case 6, etc.) may be assembled to the display set 3. The button device 8 may substantially independently include all the configurations that enable the button push operation as described above as a single electronic component that is disposed between the display set 3 and the bracket 4. Thus, when there is an abnormality in terms of the button push operation of the button device 8, the reason for the abnormality would exist in the button device 8, which may be replaced with a new button device 8. According to an embodiment, the button device 8 may be disposed between the display set 3 and the bracket 4 to be supported by the display set 3 and the bracket 4.

Figure 9:
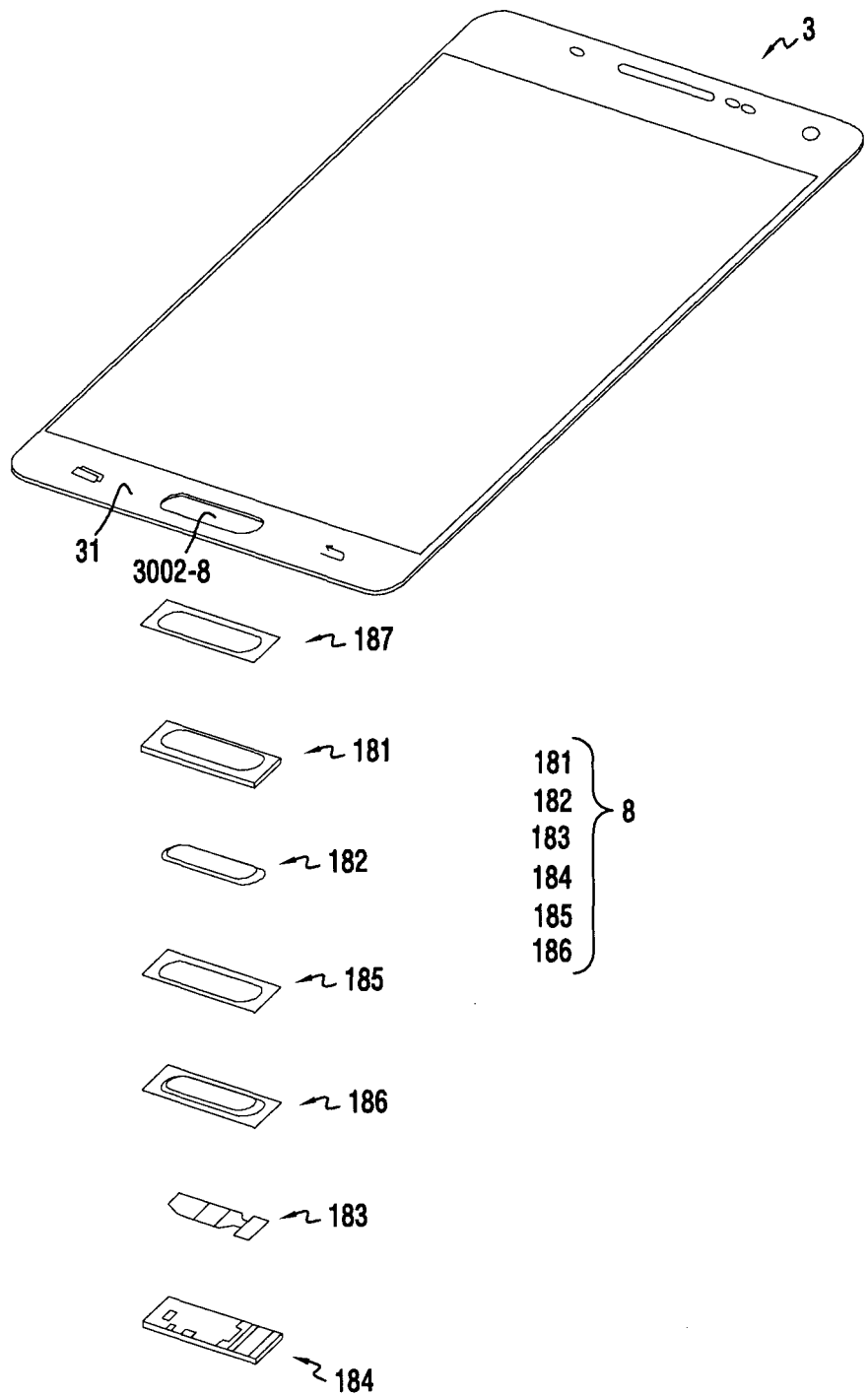
FIG. 9 is a perspective view illustrating a button device according to another embodiment of the present disclosure and a display set in a disassembled state.
Figure 10:
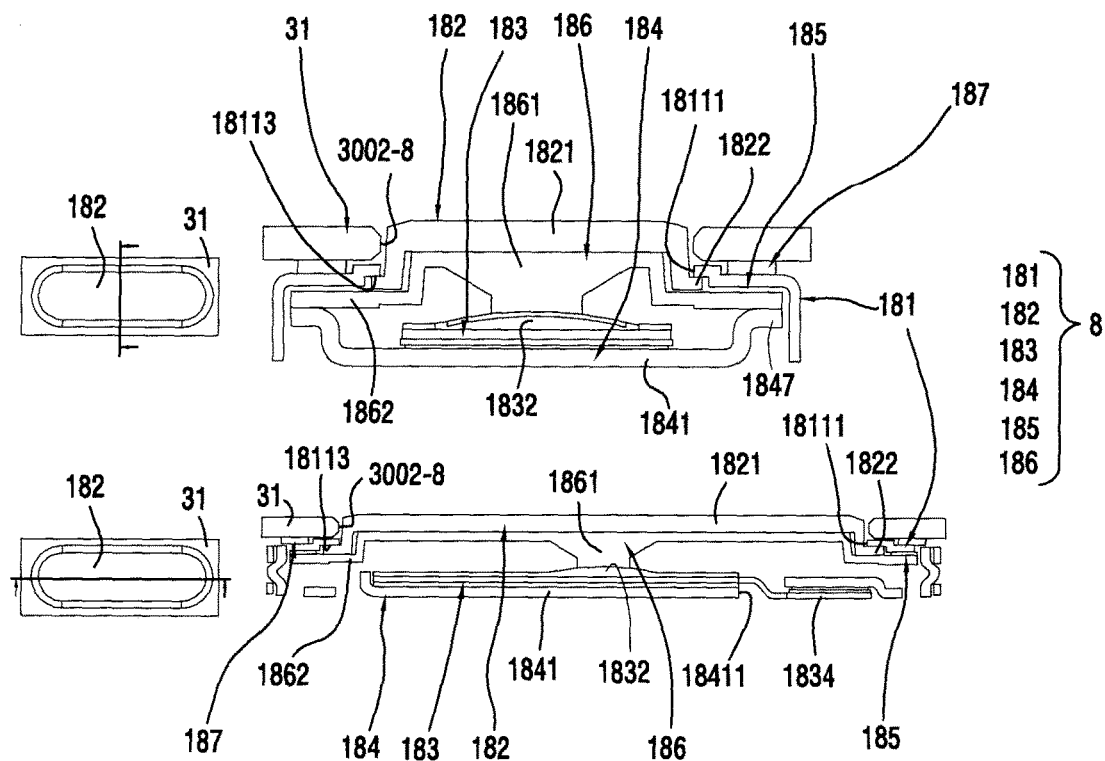
FIG. 10 illustrates cross-sectional views of the button device according to the embodiment of the present disclosure and the display set in the assembled state.

FIG. 9 is a perspective view illustrating a button device according to another embodiment of the present disclosure, and a display set in a disassembled state, and FIG. 10 illustrates cross-sectional views of the button device according to the embodiment of the present disclosure and the display set in the assembled state.

Referring to FIGS. 9 and 10, the button device 8 may include a first housing 181, a second housing 184, a button 182, a rubber 186, a double-sided tape 185, and a dome switch circuit 183.

The first housing 181 and the second housing 184 may be similar to the first housing 81 and the second housing 84 described above with reference to FIGS. 5A to 7 except in the ways described herein. The first and second housings 181, 184 may be coupled to each other to provide a space in which the button 182, the rubber 186, the first double-sided tape 185, and the dome switch circuit 183 may be mounted.

The button 182 may include a button top 1821, and an annular flange 1822 that extends from the rim of the button top 1821 in the radial direction. As illustrated, the button top 1821 may have a shape similar to an inverted bowl, and may be inserted into the opening 18111 of the first housing 181. The flange 1822 may be installed by being fitted to the annular recess 18113 that is formed inside along the rim of the opening 18111 of the first housing 181.

The rubber 186 may be disposed vertically below the button 182, and may include a central portion 1861, and an annular extension portion 1862 that extends from the rim of the central portion 1861 in the radial direction. The central portion 1861 may have a shape that is capable of being fitted to the inner space of the button top 1821 of the button 182 and may additionally have a shape that protrudes toward the metal dome 1832. The extension portion 1862 may have a thickness thinner than that of the central portion 1861, and may elastically support the movement of the button 182. The rim of the extension portion 1862 may be attached to the ceiling portion 1811 of the first housing 181, in particular, to the periphery of the annular recess 18113 of the first housing 181 by using the annular first double-sided tape 185, as illustrated.

Even if foreign matter, such as water or dust, infiltrates into a gap between the button 182 and the opening 18111 of the first housing 181, the foreign matter cannot enter the inner space of the housings 181 and 184 due to the rubber 186 which impedes or prevents its ingress. In addition, the rim 1847 of the second housing 184 abuts the rim of the extension portion 1862 of the rubber 186 toward the first double-sided table 185, and such a support structure may increase the bonding force between the rim of the extension portion 1862 of the rubber 186 and the first housing 181.

The dome switch circuit 183 may be similar to the dome switch circuit 83 described above with reference to FIGS. 5A to 7 except in the ways described herein. The dome switch circuit 183 may be installed to the bottom portion 1841 of the second housing 184. The metal dome 1832 of the dome switch circuit 183 may be disposed vertically below the central portion 1861 of the rubber 186, and the external contacts 1834 of the dome switch circuit 183 may extend through the opening 18411 that is formed in the bottom portion 1841 of the second housing 184, and may be attached to the outer surface of the bottom portion 1841 of the second housing 184.

The above-described button device 8 may be attached to the window 31 of the display set 3. As illustrated, the outer surface around the opening 18111 of the ceiling portion 1811 may be attached to the surface around the opening 3002-8 of the window 31 by using an annular second double-sided tape 187. Accordingly, even if foreign matter infiltrates through the opening 3002-8 of the window 31, the foreign matter may hardly move to the gap between the first housing 181 and the window 31.

Figure 11A:
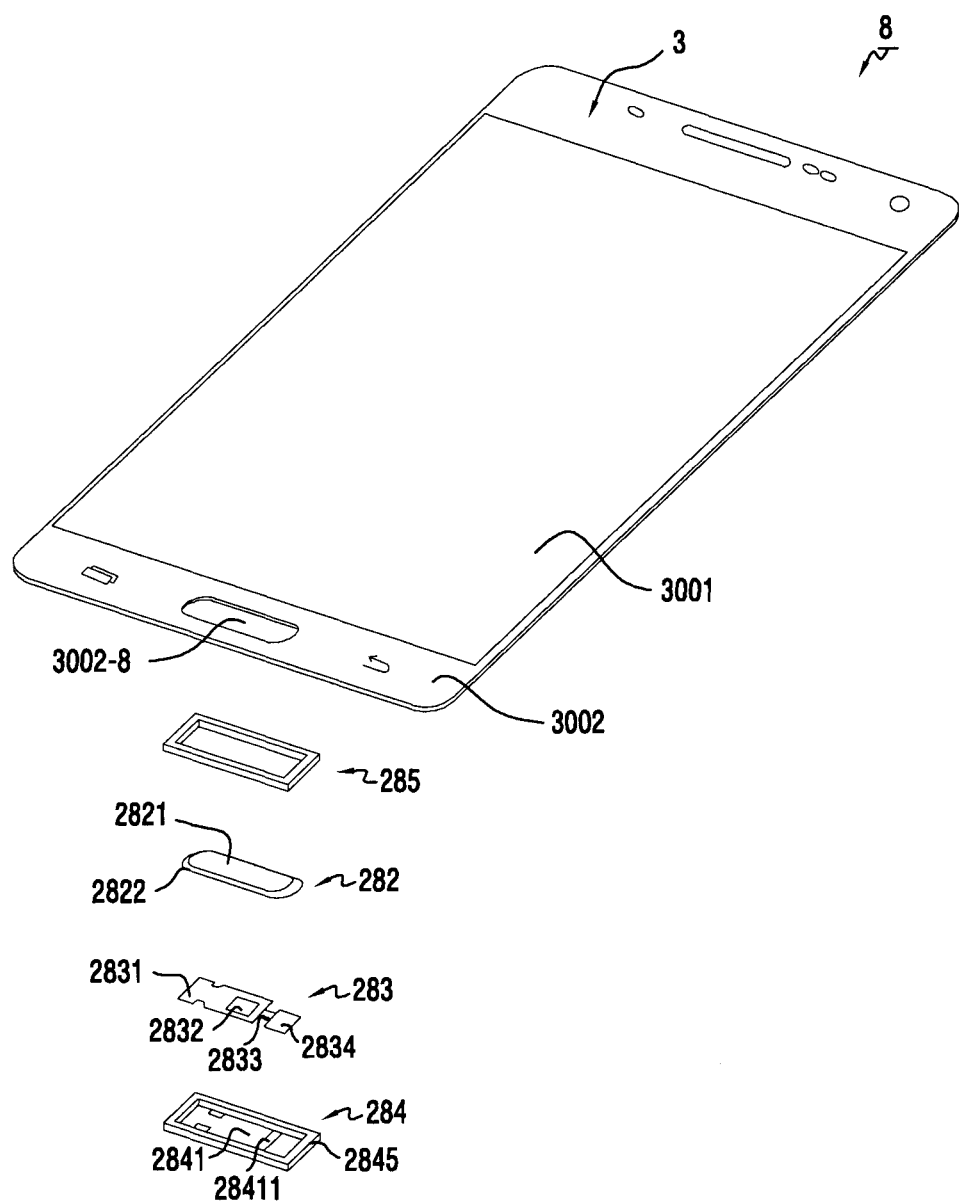
FIG. 11A and FIG. 11B are perspective views of the button device according to another embodiment of the present disclosure in a disassembled state.
Figure 11B:
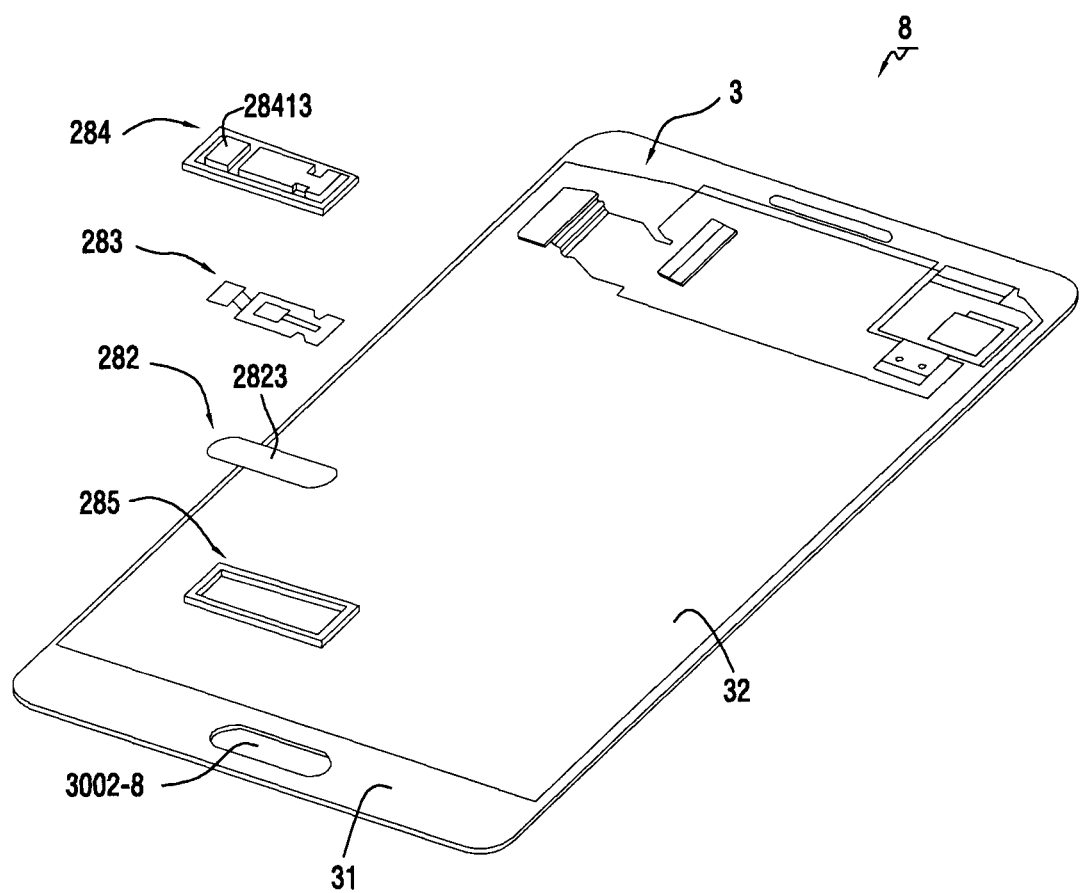

FIGS. 11A and 11B are perspective views of a button device according to another embodiment of the present disclosure in a disassembled state.

Referring to FIGS. 11A and 11B, the button device 8 may include a window 31 of a display set 3, a double-sided tape 285, a button 282, a dome switch circuit 283, and a bottom housing 284.

The window 31 of the display set 3 and the bottom housing 284 are coupled to each other via the double-sided tape 285 to provide a mounting space, and the button 282 and the dome switch circuit 283 may be mounted in the mounting space.

The window 31 of the display set 3 may form the button pass hole 3002-8, and the button top 2821 of the button 282 may be inserted into the button pass hole 3002-8 to be exposed to the outside. In addition, the window 31 may have an annular recess (not illustrated) formed on the inner surface along the rim of the button pass hole 3002-8. The flange 2822 of the button 282 may be mounted by being fitted to the recess.

The button 282 may include a button top 2821, a flange 2822, and an actuator 2823 that are similar to the button top 821, the flange 822, and the actuator 823 that are described above with reference to FIG. 3, and thus the descriptions thereof will be omitted.

The dome switch circuit 283 may include a substrate 2831, a metal dome 2832, an FPCB 2833, and external contacts 2834 that are similar to the constituent elements of the dome switch circuit 83 that are described above with reference to FIGS. 5A and 5B, and thus the descriptions thereof will be omitted.

The bottom housing 284 may include a bottom portion 2841 where the substrate 2831 of the dome switch circuit 283 may be installed, an annular attachment portion 2845 that is disposed on the outer rim of the bottom portion 2841 and is attached to the window 31 of the display set 3, and a through-hole 28411 (FIG. 11A) that is formed on the bottom portion 2841 and allows the FPCB 2833 of the dome switch circuit 283 to pass therethrough. The attachment portion 2845 of the bottom housing 284 may be attached to the window 31 of the display set 3 via the double-sided tape 285. In addition, the FPCB 2833 of the dome switch circuit 283 may extend to pass through the through-hole 28411 of the bottom housing 284, and the external contacts 2834 may be attached to the outer surface of the bottom portion 2841 of the bottom housing 284. According to various embodiments, the bottom housing 284 may further include a recess 28413 (FIG. 11B) that is formed on the outer surface of the bottom portion 2841, and the external contacts 2834 of the dome switch circuit 283 may be attached to the recess 28413 of the bottom portion 2841 of the bottom housing 284 by using an adhesive means, such as a double-sided tape. The external contacts 2834 arranged in this way may be electrically connected to the main circuit board 5 (FIG. 2).

Figure 12A:
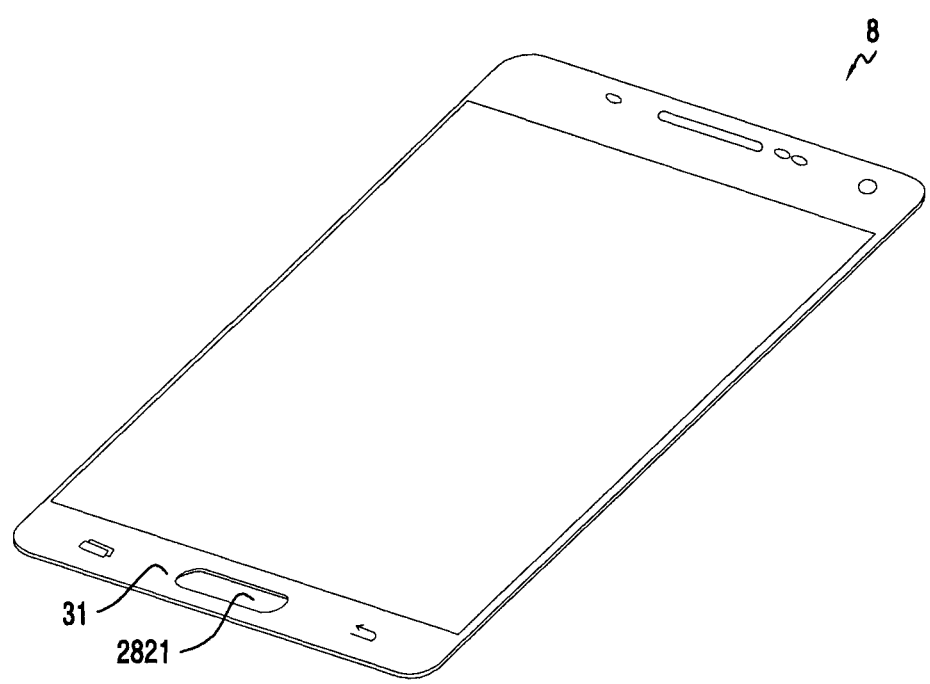
FIG. 12A and FIG. 12B are perspective views illustrating a button device according to another embodiment of the present disclosure in an assembled state.
Figure 12B:
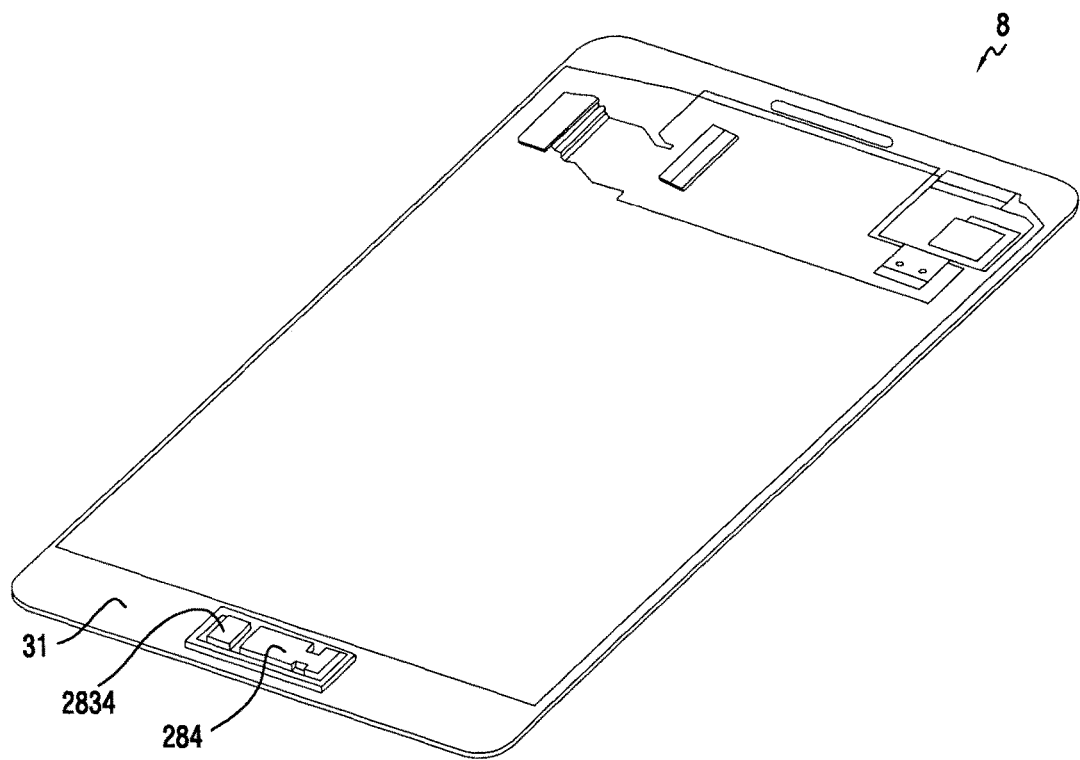

FIGS. 12A and 12B are perspective views illustrating a button device according to another embodiment of the present disclosure in an assembled state.

Referring to FIGS. 12A and 12B, a button 282 and a dome switch circuit 283 may be mounted in a coupling space of the window 31 of the display set 3 and the bottom housing 284. The button top 2821 of the button 282 may pass through the button pass hole 3002-8 of the window 31 of the display set 3 such that it is exposed to the outside. In addition, the external contacts 2834 of the dome switch circuit 283 may extend to the outside through the opening 28411 (FIG. 11A) of the bottom housing 284, and may be attached to the recess 28413 (FIG. 11B) that is formed on the outer surface of the bottom housing 284.

Figure 13:
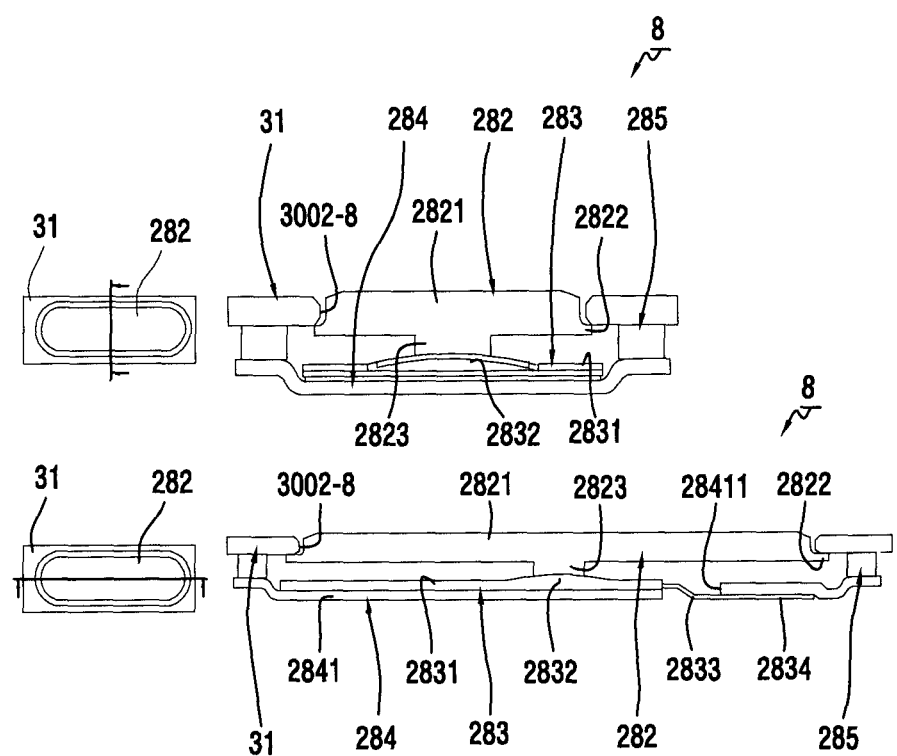
FIG. 13 illustrates a cross-sectional view of the button device according to another embodiment of the present disclosure.

FIG. 13 illustrates a cross-sectional view of the button device 8 according to another embodiment of the present disclosure.

Referring to FIG. 13, the bottom housing 284 and the window 31 may be assembled such that a space may be provided in which the button 282 and the dome switch 283 may be mounted. The button top 2821 of the button 282 may be inserted into the opening 3002-8 of the window 31, and the actuator 2823 of the button 282 may be disposed in a state where it is in contact with the metal dome 2832 mounted on the substrate 2831 of the dome switch circuit 283. Here, the button 282 may be supported by the metal dome 2832 of the dome switch circuit 283, and the flange 2822 of the button 282 may be in close contact with the step around the opening 3002-8 of the window 31. The substrate 2831 of the dome switch circuit 283 may be installed to the bottom portion 2841 of the bottom housing 284, and the external contacts 2834 extend from the substrate 2831 to pass through the opening 28411 of the bottom portion 2841 of the bottom housing 284 and may be attached to the outer surface of the bottom portion 2841.

Figure 14:
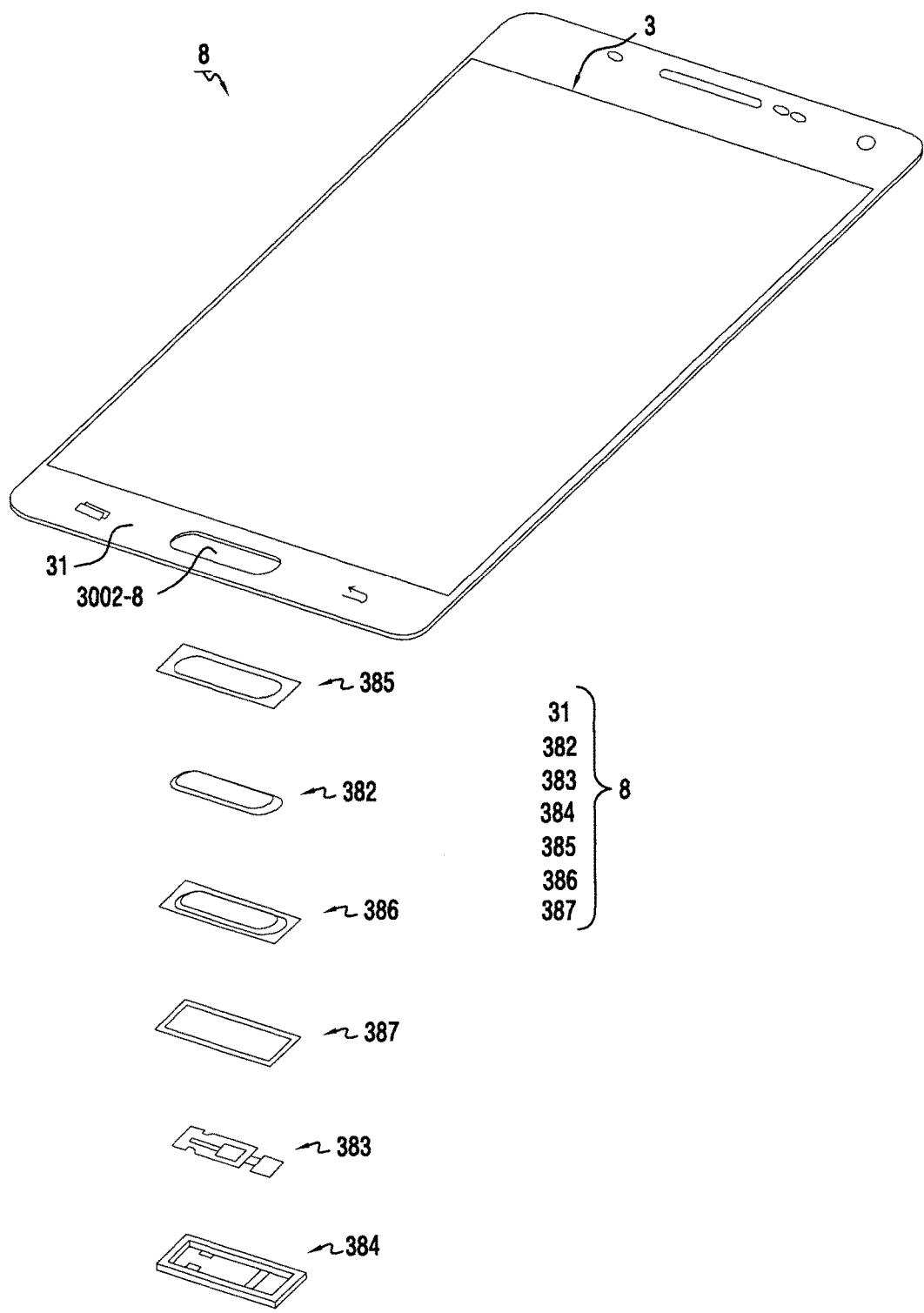
FIG. 14 is a perspective view illustrating a button device according to another embodiment of the present disclosure in a disassembled state.
Figure 15:
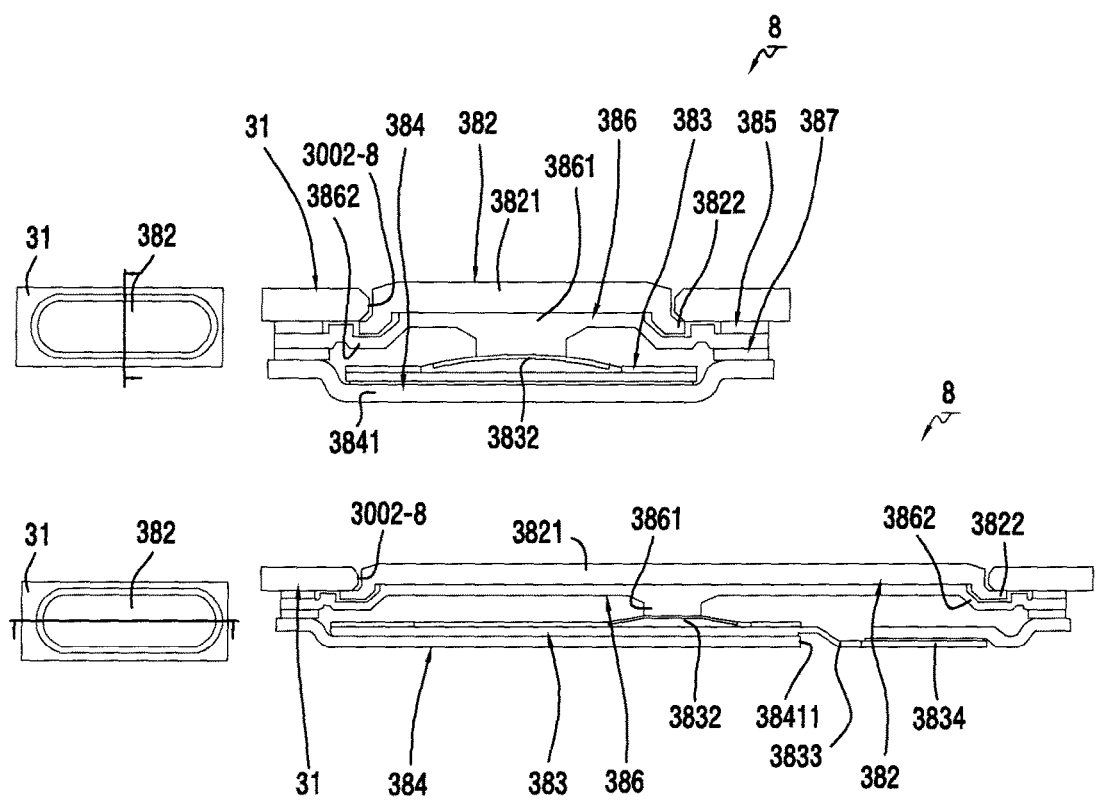
FIG. 15 illustrates cross-sectional views of the button device according to another embodiment in an assembled state.

FIG. 14 is a perspective view illustrating a button device according to another embodiment of the present disclosure in a disassembled state, and FIG. 15 illustrates cross-sectional views of the button device according to another embodiment in an assembled state.

Referring to FIGS. 14 and 15, the button device 8 may include a window 31 of a display set 3, a button 382, a rubber 386, a first double-sided tape 385, a bottom housing 384, and a dome switch circuit 383.

The button 382 may include a button top 3821, an annular flange 3822 that extends from the rim of the button top 3821 in the radial direction. As illustrated, the button top 3821 has a shape similar to an inverted bowl, and may be inserted into the opening 3002-8 of the window 31 of the display set 3. The flange 3822 may be disposed in a state where it is in close contact with a step around the opening 3002-8 of the window 31 of the display set 3.

The rubber 386 is disposed vertically below the button 382, and may include a central portion 3861, and an annular extension portion 3862 that extends from the rim of the central portion 3861 in the radial direction. The central portion 3861 has a shape that may be fitted to the inner space of the button top 3821 of the button 382, and may additionally have a shape that protrudes toward the metal dome 3832. The extension portion 3862 may have a thickness that is thinner than the central portion 3861, and may elastically support the movement of the button 3821. The rim of the extension portion 3862 may be attached to the window 31 of the display set 3, in particular, to the inner surface around the opening 3002-8 by using a first double-sided tape 385, as illustrated. Foreign matter may infiltrate into the opening 3002-8 of the window 31, but may be inhibited from moving further inwardly by the rubber 386 which may block the entry of the foreign matter.

The bottom housing 384 may be similar to the bottom housing 284 described above with reference to FIGS. 11A to 13 except in any ways described herein. The rim of the bottom housing 384 may be attached to the rim of the extension portion 3862 of the rubber 386 by using an annular second double-sided tape 387.

The dome switch circuit 383 may be similar to the dome switch circuit 283 described above with reference to FIGS. 11A to 13, and may be installed to the bottom portion 3841 of the bottom housing 384. The metal dome 3832 of the dome switch circuit 383 may be disposed vertically below the central portion 3861 of the rubber 386. In addition, the FPCB 3833 of the dome switch circuit 383 may extend to the outside of the bottom housing 384 through the opening 38411 that is formed in the bottom portion 3841 of the bottom housing 384, and the external contacts 3834 may be attached to the outer surface of the bottom portion 3841 of the bottom housing 384.

Figure 16:
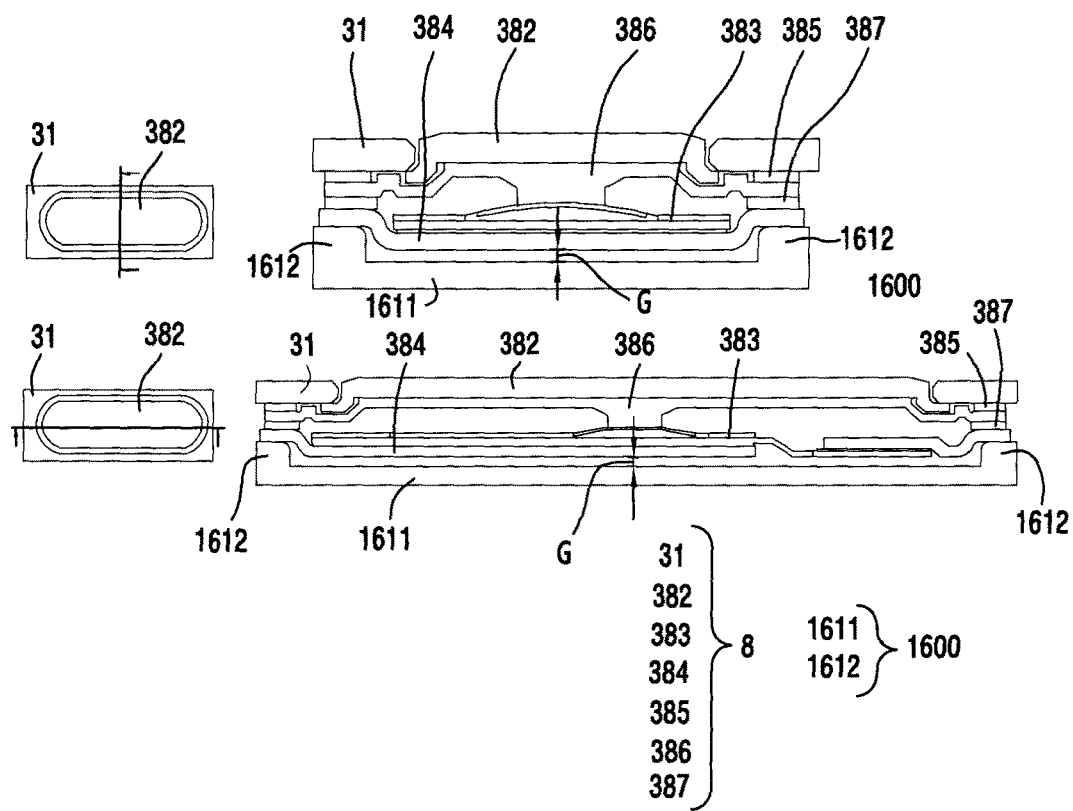
FIG. 16 illustrates cross-sectional views showing the assembled state between the button device according to various embodiments of the present disclosure and a support member.

FIG. 16 illustrates cross-sectional views showing the assembled state between the button device 8 according to various embodiments of the present disclosure and a support member 1600.

Referring to FIG. 16, the support member 1600 (e.g., a part of the bracket 4) has a bowl shape, and as illustrated, may include a bottom portion 1611, and sidewall portions 1612 that extend in the vertical direction from the rim of the bottom portion 1611. The sidewall portions 1612 may form an annular shape, and may support the rim of the bottom housing 384 of the button device 8 toward the window 31. The bottom portion 1611 of the support member 1600 is spaced from the bottom housing 384 of the button device 8 with a gap G being interposed therebetween. The gap G may serve to improve the deterioration of the click feeling of the button due to a cumulative tolerance that may occur due to the assembly of the window 31, the button 382, the rubber 386, the dome switch circuit 383, and the bottom housing 384 of the button device 8.

The button device 8 that is described above with reference to FIGS. 11A to 16 may exist in a state where it is attached to the display set 3. Here, the window 31 of the display set 3 may be allocated as a constituent element of the button device 8. In other words, the button device 8 may include all of the configurations that enable the button push operation by including the display set 3 in the configurations such that when there is an abnormality in the button push operation of the button device 8, the reason for the abnormality exists in the button device 8. When the display set 3 and the bracket 4 are separated from each other as a measure for this, the button device 8 may be separated from the bracket 4 together with the display set 3.

Figure 17:
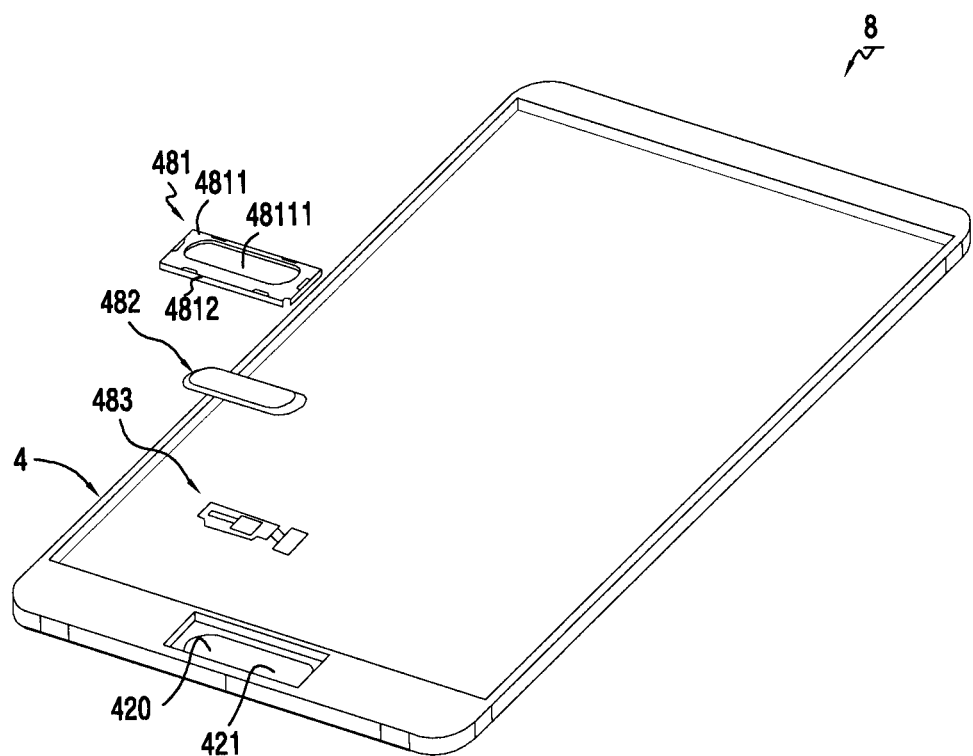
FIG. 17 is a perspective view illustrating a button device according to another embodiment of the present disclosure in a disassembled state.
Figure 18:
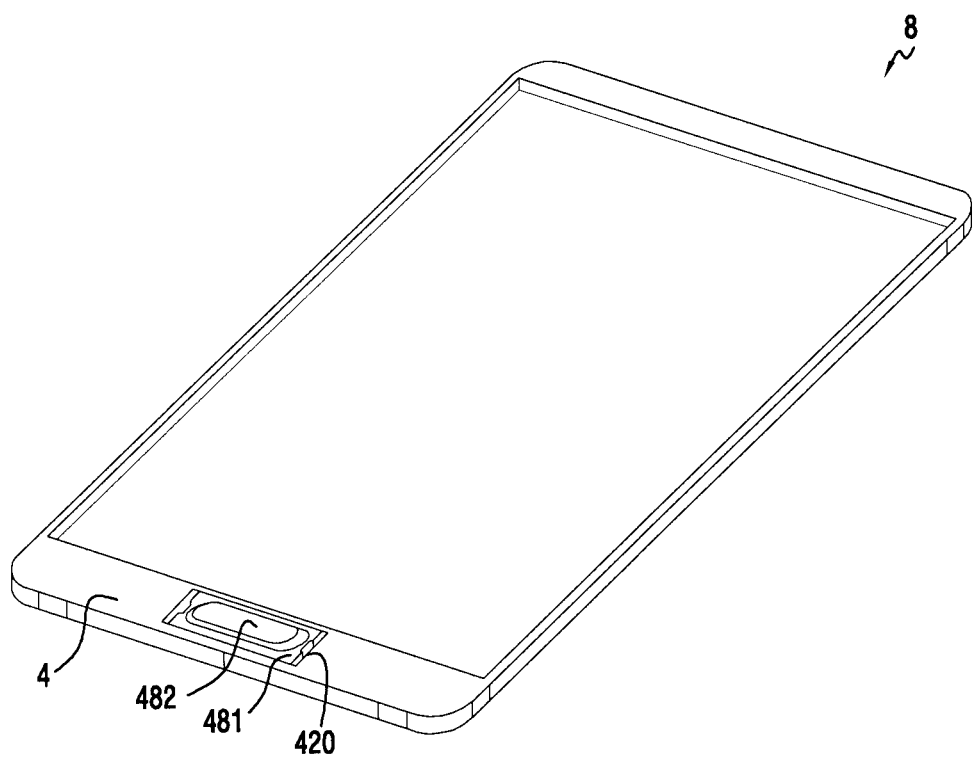
FIG. 18 is a perspective view illustrating the button device according to another embodiment of the present disclosure in an assembled state.

FIG. 17 is a perspective view illustrating a button device according to another embodiment of the present disclosure in a disassembled state, and FIG. 18 is a perspective view illustrating the button device according to another embodiment of the present disclosure in an assembled state.

Referring to FIGS. 17 and 18, the button device 8 may include a cover housing 481, a button 482, a dome switch circuit 483, and a bracket 4.

The cover housing 481 and the recess 420 of the bracket 4 may be coupled to each other to provide a mounting space, and the button 482 and the dome switch circuit 483 may be mounted in the mounting space.

The cover housing 481 may include a ceiling portion 4811, and side wall portions 4812 that extend from the rim of the ceiling portion 4811 in the vertical direction (i.e., toward the bracket 4). As illustrated, the ceiling portion 4811 may have a substantially rectangular shape, and may have an opening 48111 formed inside the rim thereof. The button top 4821 of the button 482 may be inserted into the opening 48111 of the ceiling portion 4811 to be exposed to the outside. The sidewall portions 4812 may be fitted to the recess 420 of the bracket 4 and may have a shape that elastically presses the inner surface of the recess 420 of the bracket 4.

The button 482 may include a button top, a flange, and an actuator that are similar to those of the button 82 described above with reference to FIG. 3 and the descriptions thereof will be omitted.

The dome switch circuit 483 may include a substrate, a metal dome, an FPCB, and external contacts that are similar to those of the dome switch circuit 483 described above with reference to FIGS. 5A and 5B and the descriptions thereof will be omitted.

The bracket 4 may include a recess 420, to which the cover housing 481 is fitted. The bottom 421 of the recess 420 is a portion to which the substrate of the dome switch circuit 483 is installed, and may include a through-hole (not illustrated). The FPCB of the dome switch circuit 483 extends to the opposite surface of the bracket 4 through the through-hole of the bottom 421, and thus the external contacts of the dome switch circuit 483 may be attached to the opposite surface of the bracket 4. In addition, the bottom 421 of the recess 420 of the bracket 4 may further include a recess (not illustrated) to which the external contacts of the dome switch circuit 483 are installed. The external contacts of the dome switch circuit 483 installed in this way may be electrically connected to the main circuit board 5 (see FIG. 2).

The button device 8 described above with reference to FIGS. 17 and 18 exists in a state where it is attached to the bracket 4. Here, the bracket 4 may be allocated as a constituent element of the button device 8. In other words, the button device 8 may include all the configurations that enable the button push operation by including the bracket 4 in the configurations such that when there is an abnormality in the button push operation of the button device 8, the reason for the abnormality exists in the button device 8. When the display set 3 and the bracket 4 are separated as a measure for this, the button device 8 may be separated from the display set 3 together with the bracket 4.

Figure 19:
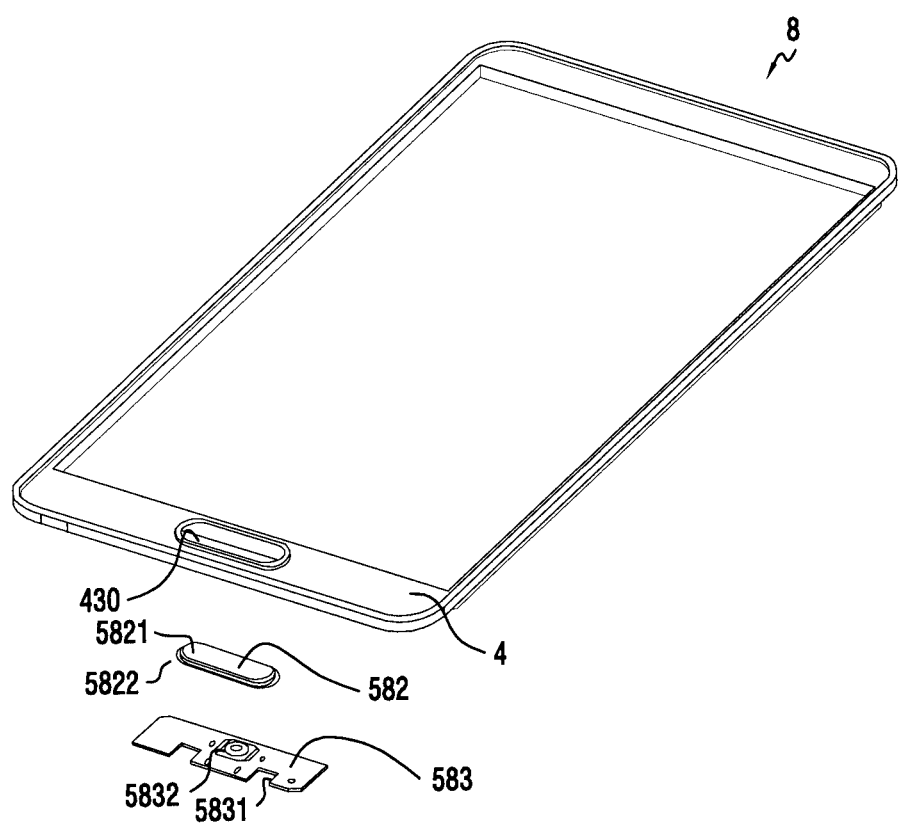
FIG. 19 is a perspective view illustrating a button device according to another embodiment of the present disclosure in a disassembled state.

FIG. 19 is a perspective view illustrating a button device according to another embodiment of the present disclosure in a disassembled state.

Referring to FIG. 19, the button device 8 may include a bracket 4, a button 582, and a dome switch circuit 583.

The bracket 4 and the dome switch 583 are coupled to each other to provide a mounting space, and the button 582 may be mounted in the mounting space.

The bracket 4 forms an opening 430, and the button top 5821 of the button 582 may pass through the opening 430 of the bracket 4 to be exposed to the outside.

The button 582 may include the button top 5821, a flange 5822, and an actuator (not illustrated). The button 582 may be similar to the button 82 described above with reference to FIG. 3.

The dome switch circuit 583 may include a substrate 5831, and a metal dome 5832 mounted on the substrate 5831, and may be similar to the dome switch circuit 83 described above with reference to FIGS. 5A and 5B.

The button device 8 described above with reference to FIG. 19 may be attached to the bracket 4. Here, the bracket 4 is allocated as a constituent element of the button device 8. In other words, the button device 8 may include all the configurations that enable the button push operation by including the bracket 4 in the configurations such that when there is an abnormality in the button push operation of the button device 8, the reason for the abnormality exists in the button device 8. When the bracket 4 and the main circuit board 5 are separated, the button device 8 may be separated from the main circuit board 5 together with the bracket 4.

Figure 20:
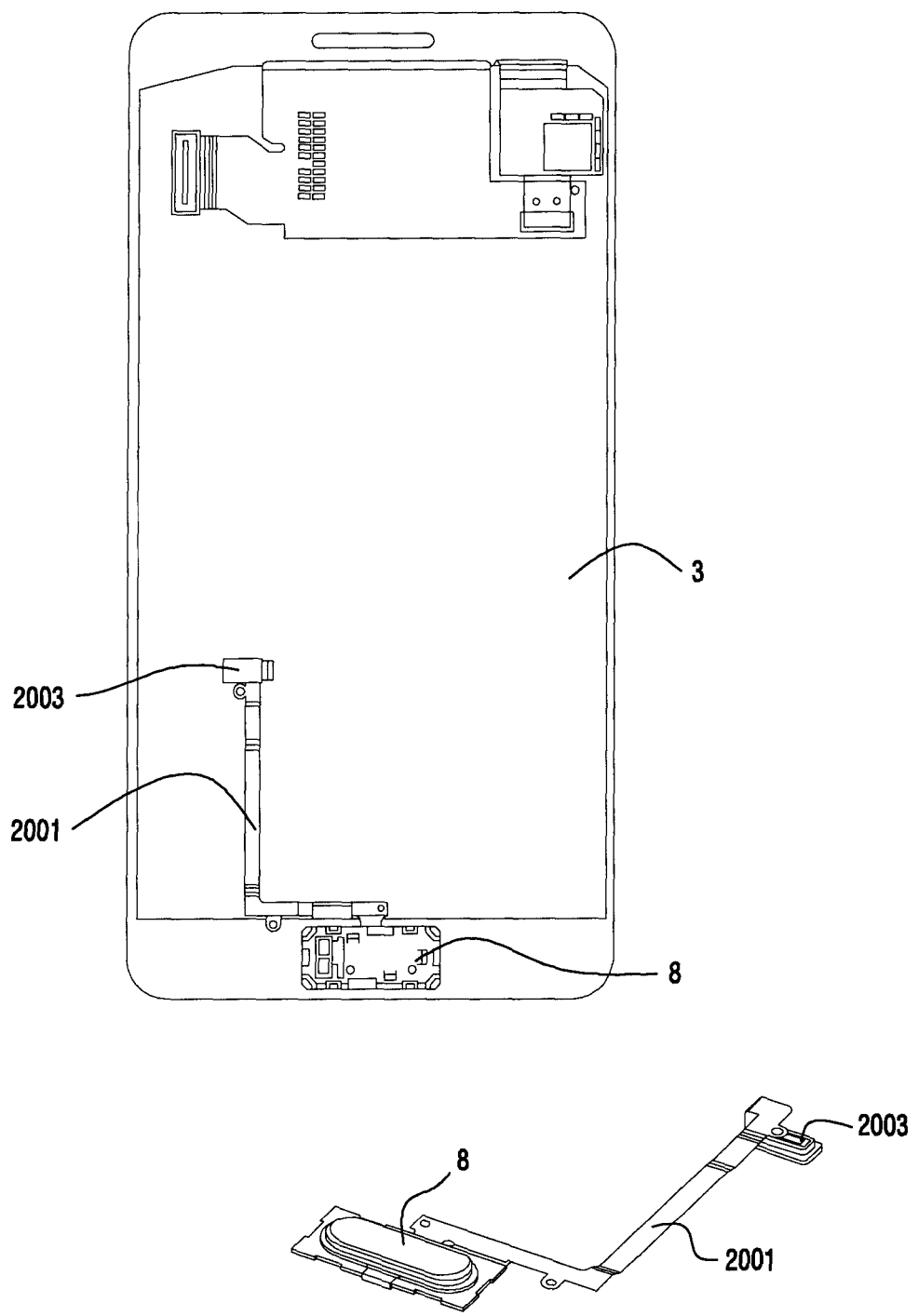
FIG. 20 illustrates a button device according to another embodiment of the present disclosure.

FIG. 20 illustrates a button device according to another embodiment of the present disclosure.

Referring to FIG. 20, the button device 8 may take any one of the configurations illustrated in FIGS. 5A to 19. In particular, the button device 8 may be further equipped with a sensor. For example, the button device 8 may further include a fingerprint recognition sensor that accumulates data for the user's fingerprint through the button. In addition, the FPBC 2001, which is added with a connector 2003, may be electrically connected to the button device 8. The connector 2003 may be electrically connected to the main circuit board 5 (see FIG. 2). The button device 8, the FPCB 2001, and the connector 2003 may be attached to the display set 3.

According to an embodiment of the present disclosure, an electronic device (e.g., a terminal 100) may include a first member (e.g., a window 31) that forms at least a part of an exterior of the electronic device and includes an opening 3002-8. The device may also include a second member (e.g., a bracket 4) that is disposed inside the electronic device. At least one electronic component (e.g., a display 32 or any other hardware component) may be disposed between the first member and the second member not to overlap with the opening of the first member. A button device 8 that includes a button 82 may be inserted into the opening 3002-8 of the first button and a dome switch 83 may be disposed at a position where the dome switch 83 is pressed by the button 82. The button device 8 may be disposed inside the electronic device. Here, the button device 8 may be coupled to the first member or the second member such that the button device 8 may exist integrally with the first member of the second member.

According to a first embodiment of the present disclosure, the button device 8 may include housings 81 and 84 that are disposed between the first member (e.g., the window 31) and the second member (e.g., the bracket 4), and accommodates the button 82 and the dome switch 83. Here, the housings 81 and 84 may include an opening 3111 that corresponds to the opening 3002-8 of the first member, and the button 82 may be inserted into the opening 3111 of the housings 81 and 84.

According to the first embodiment of the present disclosure, the button device 8 may include a second opening 8411 that is formed in the housings 81 and 84 and at least one contact 834 that extends from the dome switch 83 through the second opening 8411 and may be disposed outside the housings 81 and 84.

According to the first embodiment of the present disclosure, the housings 81 and 84 may include a first housing 81 that includes a ceiling portion 811 that forms a ceiling portion 811 of the housings that corresponds to the opening 3111 of the first member (e.g., the window 31), and a second housing 84 that is coupled to the first housing 81 and includes a bottom portion 841 on which the dome switch 83 is installed.

According to the first embodiment, the first housing 81 may include a first sidewall portion 812 that extends in a vertical direction from a rim of the ceiling portion 811, and the second housing 84 may include a second sidewall portion 842 that extends in a vertical direction from a rim of the bottom portion 841. Here, the first sidewall portion 812 and the second sidewall portion 842 may be coupled with each other by using snap-fits and may overlap one another.

According to the first embodiment of the present disclosure, the button device 8 may further include a rubber 186 that is interposed between the button 182 and the dome switch 183. An annular rim of the rubber 186 may be attached to an annular surface around the opening 18111 of the housing 181.

According to the first embodiment of the present disclosure, the second member (e.g., the bracket 4) may include a bottom portion 1611 and a sidewall portion 1612 that extends in a vertical direction from a rim of the bottom portion 1611. Here, the annular sidewall portion 1612 of the second member may support the annular rim of the housing 184 and urge it toward or maintain its position relative to the first member (e.g., the window 31), and the bottom portion 1611 of the second member may be spaced apart from the housing 384 with a gap G being interposed therebetween.

According to a second embodiment of the present disclosure, the button device 8 may include a housing 184 that is disposed between the first member (e.g., the window 31) and the second member (e.g., the bracket 4) and may be attached to the first member so as to form a space that accommodates the button 82 and the dome switch 83 together with the first member.

According to the second embodiment of the present disclosure, the button device 8 may further include an opening 18411 that is formed in the housing 184, and at least one contact 1834 that extends from the dome switch 183 to pass through the opening 18411 and is disposed outside the housing 184.

According to the second embodiment of the present disclosure, the button device 8 may further include a rubber 386 that is disposed between the button 382 and the dome switch 383. An annular rim of the rubber 386 may be attached to the annular surface around the opening 3002-8 of the first member (e.g., the window 31).

According to the second embodiment of the present disclosure, the second member (e.g., the bracket 4) may include a bottom portion 1611 and an annular sidewall portion 1612 that extends from the rim of the bottom portion 1611 in the vertical direction. Here, the annular sidewall portion 1612 of the second member may support the annular rim of the housing 384 toward the first member (e.g., the window 31), and the bottom portion 1611 of the second member may be spaced apart from the housing 384 with a gap G being interposed therebetween.

According to a third embodiment of the present disclosure, the button device 8 may include a housing 481 (FIG. 17) that is disposed between the first member (e.g., the window 31) and the second member (e.g., the bracket 4) and is attached to the second member so as to form a space that accommodates the button 482 and the dome switch 483 together with the second member. The housing 481 may include an opening 48111 that corresponds to the opening 3002-8 of the first member (e.g., the window 31), and the button 482 may be inserted into the opening 48111 of the housing 481.

According to the third embodiment of the present disclosure, the housing 481 may be fitted to a recess 420 that is formed in the second member (e.g., the bracket 4), and the dome switch 483 may be installed to the bottom 421 of the recess 420 of the second member.

According to the third embodiment of the present disclosure, the button device 8 may further include an opening formed in the bottom 421 of the recess 420 of the second member (e.g., the bracket 4) and at least one contact that extends from the dome switch 483 to pass through the opening of the second member and is disposed outside the second member.

According to the fourth embodiment of the present disclosure, the button device 8 may include an opening 430 that is formed in the second member (e.g., the bracket 4) to correspond to the opening 3002-8 of the first member (e.g., the window 31), and a substrate 538 that is attached to the second member so as to form a space that accommodates the button 582 and the dome switch 5832 together with the second member. Here, the button 582 may be inserted into the second member opening 430, and the dome switch 5832 may be mounted on the substrate 583.

According to the fourth embodiment, the button device 8 may further include at least one contact mounted on a mounting surface that is opposite to the mounting surface of the substrate 583 where the dome switch 5832 is mounted. Here, the at least one contact may be electrically connected with the dome switch 5832.

According to various embodiments of the present disclosure, the electronic device 100 may further include a circuit board 5 that is disposed vertically below the second member (e.g., the bracket 4) and may be electrically connected with the button device 8.

According to various embodiments of the present disclosure, the electronic device 100 may further include a third member 3 (e.g., the case 6) that is coupled with the second member (e.g., the bracket 4) and forms a space that accommodates the circuit board 5 together with the second member.

According to various embodiments of the present disclosure, the button device 8 may further include a fingerprint recognition sensor.

According to various embodiments of the present disclosure, the button device 8 may be attached to an annular surface around the opening 3002-8 of the first member (e.g., the window 31) by using a double-sided tape.

According to various embodiments of the present disclosure, an electronic device (e.g., a terminal 100) may include a window 31 that includes an opening 3002-8, a circuit board 5 that is disposed vertically below the window 31, a bracket 4 that is disposed between the window 31 and the circuit board 5, a display 32 that is disposed between the window 31 and the bracket 4 not to overlap with the opening 3002-8 of the window 31, a button device 8 that includes a button 82 that is disposed vertically below the window 31 and is inserted into the opening of the window 31, a dome switch 83 that is disposed vertically below the button 82, and at least one contact that is electrically connected to the dome switch 83. Here, the button device 8 may be integrally coupled to the window 31 or the bracket 4. At least one contact of the button device 8 may be electrically connected to the circuit board 5.

An electronic device according to various embodiments of the present disclosure may be a device including a communication function. For example, the electronic device may include at least one of a smart phone, a tablet personal computer (PC), a mobile phone, a video phone, an e-book reader, a desktop PC, a laptop PC, a netbook computer, a personal digital assistant (PDA), a portable multimedia player (PMP), an MP3 player, a mobile medical device, a camera, a wearable device (e.g., a head-mounted-device (HMD) such as electronic glasses, electronic clothes, an electronic bracelet, an electronic necklace, an electronic appcessory, an electronic tattoo, or a smart watch).

According to some embodiments, the electronic device may be a smart home appliance with a communication function. The smart home appliances may include at least one of, for example, televisions, digital video disk (DVD) players, audio players, refrigerators, air conditioners, cleaners, ovens, microwaves, washing machines, air purifiers, set-top boxes, TV boxes (e.g., HomeSync™ of Samsung, Apple TV™, or Google TV™), game consoles, electronic dictionaries, electronic keys, camcorders, or electronic frames.

According to some embodiments, the electronic device may include at least one of various medical appliances (e.g. Magnetic Resonance Angiography (MRA), Magnetic Resonance Imaging (MRI), Computed Tomography (CT) machine, and an ultrasonic machine), navigation devices, Global Positioning System (GPS) receivers, Event Data Recorders (EDRs), Flight Data Recorders (FDRs), automotive infotainment devices, electronic equipments for ships (e.g. navigation equipments for ships, gyrocompasses, or the like), avionics, security devices, head units for vehicles, industrial or home robots, Automatic Teller Machines (ATM) of banking facilities, and Point Of Sales (POSs) of shops.

According to some embodiments, the electronic device may include at least one of a part of furniture or a building/structure having a communication function, an electronic board, an electronic signature receiving device, a projector, and various kinds of measuring instruments (e.g., a water meter, an electric meter, a gas meter, a radio wave meter, and the like). The electronic device according to the embodiment of the present disclosure may be a combination of one or more of the aforementioned various devices. Further, the electronic device according to various embodiments of the present disclosure may be a flexible device. Further, it will be apparent to those skilled in the art that the electronic device according to various embodiments of the present disclosure is not limited to the aforementioned devices.

Hereinafter, an electronic device according to various embodiments of the present disclosure will be described with reference to the accompanying drawings. The term "user" as used in various embodiments of the present disclosure may indicate a person who uses an electronic device or a device (e.g., artificial intelligence electronic device) that uses an electronic device.

Various embodiments of the present disclosure disclosed in this specification and the drawings are merely specific examples presented in order to easily describe technical details of the present disclosure and to help the understanding of the present disclosure, and are not intended to limit the scope of the present disclosure. Therefore, it should be understood that, in addition to the embodiments disclosed herein, all modifications and changes or modified and changed forms derived from the technical idea of various embodiments of the present disclosure fall within the scope of the present disclosure.

What is claimed is:

1. An electronic device comprising:
    a window that forms at least a part of an exterior of the electronic device and includes an opening;
    a bracket that is disposed within an interior of the electronic device, wherein the bracket includes a bottom portion;
    a display that is disposed between the window and the bracket, the display being disposed in a non-overlapping position relative to the opening of the window; and
    a button device that includes a button that is disposed within the opening of the window and a dome switch that is disposed at a position where the dome switch is pressable by the button,
    wherein the button device includes:
        a housing that is disposed between the window and the bracket for accommodating the button and the dome switch; and
        a rubber disposed between the button and the dome switch to form a waterproof seal of the opening of the window, wherein an annular rim of the rubber is attached to the housing, and
    wherein the bottom portion of the bracket is spaced apart from the housing with a gap being interposed therebetween, thereby preventing deterioration of click feeling of the button device.

2. The electronic device of claim 1, wherein the housing is a housing component that accommodates the button and the dome switch, and
    wherein the housing component includes an opening that is aligned with the opening of the window, and the button is disposed within the opening of the housing component.

3. The electronic device of claim 2, wherein a second opening is formed in the housing component; and
    at least one contact extends from the dome switch through the second opening and is disposed outside of the housing.

4. The electronic device of claim 2, wherein the housing component includes:
    a first housing that includes a ceiling portion that includes an opening that is aligned with the opening of the window and a first sidewall portion; and
    a second housing that includes a bottom portion on which the dome switch is installed and a second sidewall portion,
    wherein the first sidewall portion and the second sidewall portion are coupled together such that the first housing, the second housing, the first sidewall portion, and the second sidewall portion encapsulate the button and the dome switch.

5. The electronic device of claim 2, wherein the bracket further includes a sidewall portion that extends in a vertical direction from a rim of the bottom portion, and
    wherein the sidewall portion of the bracket supports a rim of the housing.

6. The electronic device of claim 1,
    wherein the housing is attached to the window so as to form a space that accommodates the button and the dome switch together with the window.

7. The electronic device of claim 6, wherein
    an opening is formed in the housing; and
    at least one contact extends from the dome switch through the opening and is disposed outside the housing.

8. The electronic device of claim 6, wherein the bracket further includes a sidewall portion that extends from a rim of the bottom portion in a vertical direction, and
    wherein the sidewall portion of the bracket supports a rim of the housing.

9. The electronic device of claim 1, further comprising:
    a third member that is coupled to the bracket and forms a space that accommodates a circuit board together with the bracket.

10. The electronic device of claim 1, wherein the button device further includes:
    a fingerprint recognition sensor.

* * * * *